United States Patent
Kolesnikov

(10) Patent No.: US 10,873,761 B2
(45) Date of Patent: Dec. 22, 2020

(54) METHOD, APPARATUS AND SYSTEM FOR ENCODING AND DECODING A SUBSET OF TRANSFORM UNITS OF ENCODED VIDEO DATA

(71) Applicant: Volodymyr Kolesnikov, Marsfield (AU)

(72) Inventor: Volodymyr Kolesnikov, Marsfield (AU)

(73) Assignee: Canon Kabushiki Kaisha, Tokyo (JP)

(*) Notice: Subject to any disclaimer, the term of this patent is extended or adjusted under 35 U.S.C. 154(b) by 194 days.

(21) Appl. No.: 14/394,065

(22) PCT Filed: Apr. 12, 2013

(86) PCT No.: PCT/AU2013/000380
§ 371 (c)(1),
(2) Date: Oct. 10, 2014

(87) PCT Pub. No.: WO2013/152401
PCT Pub. Date: Oct. 17, 2013

(65) Prior Publication Data
US 2015/0078443 A1    Mar. 19, 2015

(30) Foreign Application Priority Data
Apr. 13, 2012  (AU) .................. 2012202182

(51) Int. Cl.
*H04N 19/60* (2014.01)
*H03M 7/40* (2006.01)
(Continued)

(52) U.S. Cl.
CPC .......... *H04N 19/60* (2014.11); *H03M 7/4075* (2013.01); *H04N 19/124* (2014.11);
(Continued)

(58) Field of Classification Search
CPC ..... H04N 19/124; H04N 19/13; H04N 19/176
See application file for complete search history.

(56) References Cited

U.S. PATENT DOCUMENTS 6,560,365 B1    5/2003  Nakayama et al.
6,987,468 B1    1/2006  Malvar
(Continued)

FOREIGN PATENT DOCUMENTS

CN    101543036 A    9/2009
CN    101779466 A    7/2010
(Continued)

OTHER PUBLICATIONS

Lou, et al., "Improving coeff_abs_level_minus3 coding performance under high bitrate", Joint Collaborative Team on Video Coding (JCT-VC) of ITU-T SG16 WP3 and ISO/IEC JTC1/SC29/WG11, 8th Meeting: San Jose, CA, Feb. 1-10, 2012, Document: JCTVC-H0497r1, pp. 1-10.
(Continued)

*Primary Examiner* — Zhubing Ren
(74) *Attorney, Agent, or Firm* — Canon U.S.A., Inc. IP Division

(57) ABSTRACT

A method of decoding a transform unit (e.g., 400) of encoded video data using Golomb-Rice decoding is disclosed. Significant residual coefficients for a sub-set of the transform unit are determined A predetermined Rice parameter for Golomb-Rice decoding of the subset of the transform unit is selected. The predetermined Rice parameter being offset from a zero setting when the determined number of significant residual coefficients is higher than a predetermined threshold. The subset of the transform unit is decoded using the predetermined Rice parameter as an initial parameter for the Golomb-Rice decoding.

12 Claims, 21 Drawing Sheets

(51) Int. Cl.
*H04N 19/13* (2014.01)
*H04N 19/61* (2014.01)
*H04N 19/14* (2014.01)
*H04N 19/18* (2014.01)
*H04N 19/124* (2014.01)

(52) U.S. Cl.
CPC ............ *H04N 19/13* (2014.11); *H04N 19/14* (2014.11); *H04N 19/18* (2014.11); *H04N 19/61* (2014.11)

(56) References Cited

U.S. PATENT DOCUMENTS

| | | |
|---|---|---|
| 2006/0171465 A1 | 8/2006 | Thyagarajan |
| 2010/0027625 A1 | 2/2010 | Wik et al. |
| 2010/0054617 A1* | 3/2010 | Takada ................. H04N 19/13 382/238 |
| 2011/0248873 A1 | 10/2011 | Karczewicz et al. |
| 2012/0121012 A1* | 5/2012 | Shiodera .......... H04N 19/00121 375/240.03 |
| 2013/0188727 A1* | 7/2013 | Lou ........................ H04N 19/13 375/240.18 |

FOREIGN PATENT DOCUMENTS

| | | |
|---|---|---|
| CN | 101543036 B | 10/2011 |
| CN | 102238387 A | 11/2011 |
| CN | 102282770 A | 12/2011 |
| CN | 102368385 A | 3/2012 |
| EP | 0940994 A2 | 9/1999 |
| EP | 1653628 A1 | 5/2006 |
| JP | 2005333622 A | 12/2005 |
| RU | 2355127 C2 | 5/2009 |
| WO | 2009/044346 A1 | 4/2009 |
| WO | 2008062687 A1 | 3/2010 |
| WO | 2011/013192 A1 | 2/2011 |
| WO | 2012/025215 A1 | 3/2012 |
| WO | 2013/108639 A1 | 7/2013 |

OTHER PUBLICATIONS

Nguyen, et al., "Reduced-complexity entropy coding of transform coefficient levels using a combination of VLC and PIPE", Joint Collaborative Team on Video Coding (JCT-VC) of ITU-T SG16 WP3 and ISO/IEC JTC1/SC29/WG11, 4th Meeting: Daegu, KR, Jan. 20-28, 2011, Document: JCTVC-D336, pp. 1-8.

Nguyen, et al., "Reduced-Complexity Entropy Coding of Transform Coefficient Levels Using Truncated Golomb-Rice Codes in Video Compression", 18th IEEE International Conference on Image Processing, Sep. 2011.

Zheng, et al., "MPEG-4 ALS: A Standard for Lossless Audio Coding", Jun. 2005 (English abstract included).

Nguyen, et al., "Non-CE1: High Throughput 1-8 Coding Scheme with Rice Binarization", 99. MPEG Meeting, Feb. 6, 2012-Feb. 10, 2012, San Jose,(Motion Picture Expert Group or ISO/IEC JTC1/SC29/WG11), No. m23334, Jan. 27, 2012, XP030051859, the whole document.

Kim, et al., "Non-CE1: High Throughput Binarization (HTB) method with modified level coding", Joint Collaborative Team on Video Coding (JCT-VC) of ITU-T SG16 WP3 and ISO/IEC JTC1/SC29/WG11, 8th Meeting, San Jose, CA, Feb. 1-10, 2012, JCTVC-H0510-r2.doc, URL: http://phenix.it-sudparis.eu/jct/doc_end_user/documents/8_San%20Jose/wg11/JCTVC-H0510-v3.zip.

Bross, et al., "WD5: Working Draft 5 of High-Efficiency Video Coding", Joint Collaborative Team on Video Coding (JCT-VC) of ITU-T SG16 WP3 and ISO/IEC JTC1/SC29/WG11, 7th Meeting, Geneva, CH, Nov. 21-30, 2011, JCTVC-H0269_Workingdraft.doc, pp. 45,46,73,74,166,167,175-177, URL: http://phenix.it-sudparis.eu/jct/doc_end_user/documents/8_San%20Jose/wg11/JCTVC-H0269-v1.zip.

Ross et al., "High efficiency video coding (HEVC) text specification draft 6", JCT-VC of ITU-T and ISO/IEC, JCTVC-H1003, Ver. 22, Apr. 2, 2012, pp. 1-249.

* cited by examiner

| 20 | 13 | 3 | 1 | 0 | 0 | 0 | 0 |
|----|----|---|---|---|---|---|---|
| 11 | 10 | 7 | 0 | 0 | 0 | 0 | 0 |
| 9  | 5  | 0 | 1 | 0 | 0 | 0 | 0 |
| 1  | 1  | 1 | 4 | 0 | 0 | 0 | 0 |
| 0  | 1  | 0 | 0 | 0 | 0 | 0 | 1 |
| 1  | 1  | 0 | 0 | 0 | 0 | 0 | 0 |
| 0  | 0  | 0 | 0 | 0 | 0 | 0 | 0 |
| 0  | 0  | 0 | 0 | 0 | 0 | 0 | 0 |

Fig. 4B

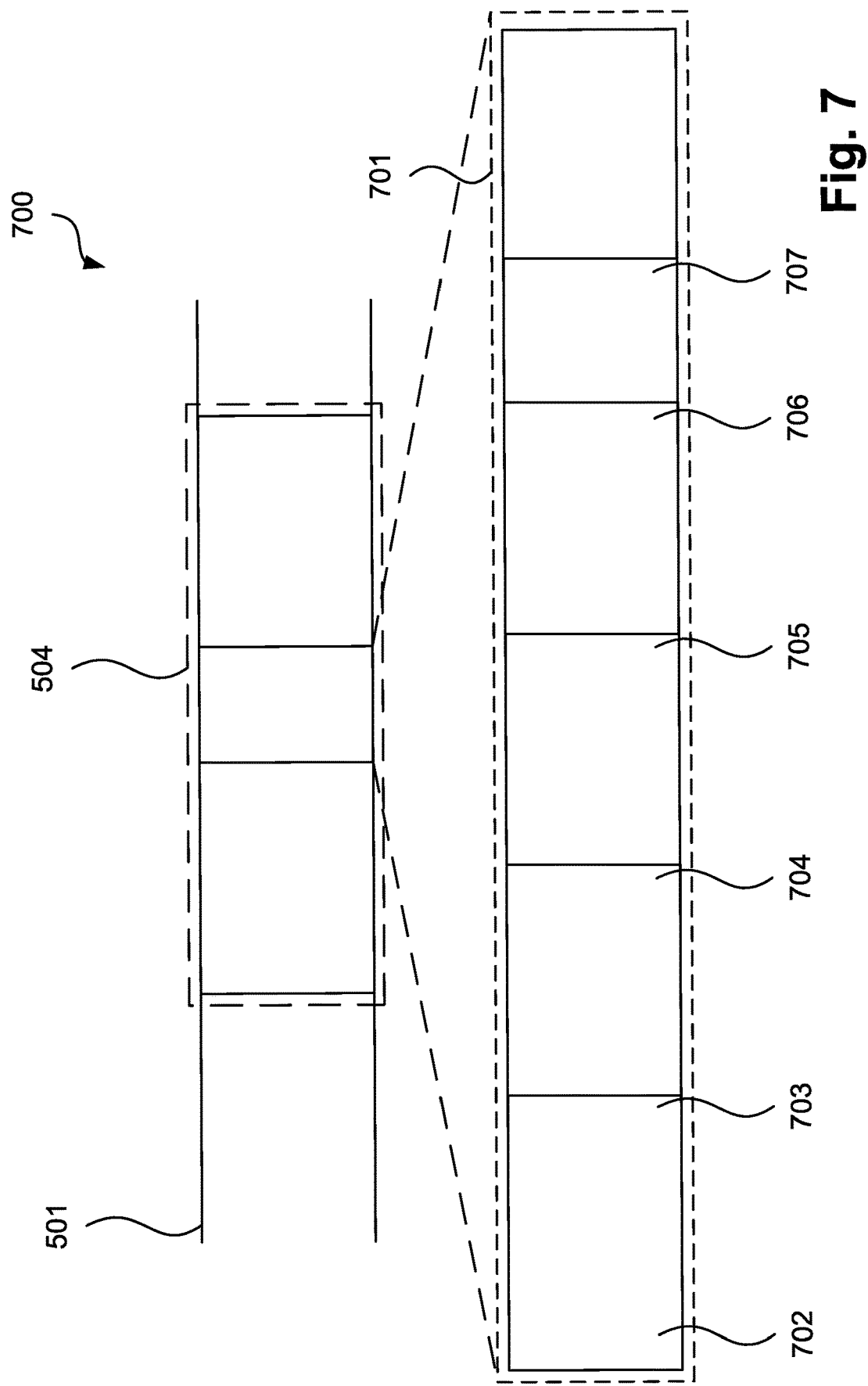

900

| Encoded Value | K=0 Codeword | K=1 Codeword |
| --- | --- | --- |
| 0 | 0 | 00 |
| 1 | 10 | 01 |
| 2 | 110 | 100 |
| 3 | 1110 | 101 |
| 4 | 11110 | 1100 |
| 5 | 111110 | 1101 |
| 6 | 1111110 | 11100 |
| 7 | 11111110 | 11101 |
| 8 | 11111111 | 111100 |
| 9 | 11111111 | 111101 |
| 10 | 11111111 | 1111100 |
| 11 | 11111111 | 1111101 |
| 12 | 11111111 | 11111100 |
| 13 | 11111111 | 11111101 |
| 14 | 11111111 | 11111110 |
| 15 | 11111111 | 11111111 |

Fig. 9

| Encoded Value minus Threshold | Codeword |
|---|---|
| 0 | 0 |
| 1 | 10 |
| 2 | 110 |
| 3 | 1110 |
| 4 | 11110 |
| 5 | 111110 |
| 6 | 1111110 |
| 7 | 11111110 |
| 8 | 111111110 |
| 9 | 1111111110 |
| 10 | 11111111110 |
| 11 | 111111111110 |
| 12 | 1111111111110 |
| 13 | 11111111111110 |
| 14 | 111111111111110 |
| 15 | 1111111111111110 |

1100

| Symbol | K=0 | K=1 | K=2 | K=3 | K=4 |
|---|---|---|---|---|---|
| 0 | 0 | 1 | 2 | 3 | 4 |
| 1 | 0 | 1 | 2 | 3 | 4 |
| 2 | 0 | 1 | 2 | 3 | 4 |
| 3 | 1 | 1 | 2 | 3 | 4 |
| 4 | 1 | 1 | 2 | 3 | 4 |
| 5 | 1 | 1 | 2 | 3 | 4 |
| 6 | 2 | 2 | 2 | 3 | 4 |
| 7 | 2 | 2 | 2 | 3 | 4 |
| 8 | 2 | 2 | 2 | 3 | 4 |
| 9 | 2 | 2 | 2 | 3 | 4 |
| 10 | 2 | 2 | 2 | 3 | 4 |
| 11 | 2 | 2 | 2 | 3 | 4 |
| 12 | 3 | 3 | 3 | 3 | 4 |
| 13 | 3 | 3 | 3 | 3 | 4 |
| 14 | 3 | 3 | 3 | 3 | 4 |
| 15 | 3 | 3 | 3 | 3 | 4 |
| 16 | 3 | 3 | 3 | 3 | 4 |
| 17 | 3 | 3 | 3 | 3 | 4 |
| 18 | 3 | 3 | 3 | 3 | 4 |
| 19 | 3 | 3 | 3 | 3 | 4 |
| 20 | 3 | 3 | 3 | 3 | 4 |
| 21 | 3 | 3 | 3 | 3 | 4 |
| 22 | 3 | 3 | 3 | 3 | 4 |
| 23 and above | 4 | 4 | 4 | 4 | 4 |

Fig. 11

METHOD, APPARATUS AND SYSTEM FOR ENCODING AND DECODING A SUBSET OF TRANSFORM UNITS OF ENCODED VIDEO DATA

TECHNICAL FIELD

The present invention relates generally to digital video signal processing and, in particular, to a method, apparatus and system for encoding and decoding a subset of transform units of video data.

BACKGROUND

Many applications for video coding currently exist, including applications for transmission and storage of video data. Many video coding standards have also been developed and others are currently under development. Recent developments in video coding standardisation have led to the formation of a group called the "Joint Collaborative Team on Video Coding" (JCT-VC). The Joint Collaborative Team on Video Coding (JCT-VC) includes members of Study Group 16, Question 6 (SG16/Q6) of the Telecommunication Standardisation Sector (ITU-T) of the International Telecommunication Union (ITU), known as the Video Coding Experts Group (VCEG), and members of the International Organisations for Standardisation/International Electrotechnical Commission Joint Technical Committee 1/Subcommittee 29/Working Group 11 (ISO/IEC JTC1/SC29/WG11), also known as the Moving Picture Experts Group (MPEG).

The Joint Collaborative Team on Video Coding (JCT-VC) has the goal of producing a new video coding standard to significantly outperform a presently existing video coding standard, known as "H.264/MPEG-4 AVC". The H.264/MPEG-4 AVC standard is itself a large improvement on previous video coding standards, such as MPEG-4 and ITU-T H.263. The new video coding standard under development has been named "high efficiency video coding (HEVC)". The Joint Collaborative Team on Video Coding JCT-VC is also considering implementation challenges arising from technology proposed for high efficiency video coding (HEVC) that create difficulties when scaling implementations of the standard to operate at high resolutions or high frame rates.

The H.264/MPEG-4 AVC video coding standard presents difficulties for achieving high compression efficiency when coding residual coefficients to represent video data.

Video data is formed by a sequence of frames, with each frame having a two-dimensional array of samples. Typically, frames include one luminance (luma) and two chrominance (chroma) channels. Colour information is typically represented using a colour space such as YUV, with Y being the luma channel and UV being two chroma channels. A colour space such as YUV gives the advantage that the majority of frame content is contained in the luma channels and a relatively smaller amount of content stored in the UV channels is sufficient to reconstruct a colour frame. The chroma channels may also be down-sampled to a lower spatial resolution with negligible perceptual quality loss.

A commonly used chroma format known as 4:2:0 results in each chroma channel having half the vertical and horizontal resolution. Each frame is decomposed into an array of largest coding units (LCUs). The largest coding units (LCUs) have a fixed size, with edge dimensions being a power of two and having equal width and height, such as 64 luma samples. A coding tree enables the subdivision of each largest coding unit (LCU) into four coding units (CUs), each having half the width and height of a parent largest coding unit (LCU). Each of the coding units (CUs) may be further subdivided into four equally-sized coding units (CUs). Such a subdivision process may be applied recursively until a smallest coding unit (SCU) size is reached, enabling coding units (CUs) to be defined down to a minimum supported size. The recursive subdivision of a largest coding unit, into a hierarchy of coding units, has a quad-tree structure and is referred to as the coding tree. The subdivision process is encoded in a communications bit-stream as a sequence of flags, coded as bins. Coding units therefore have a square shape.

A set of coding units exist in a coding tree that are not further sub-divided, occupying leaf nodes of the coding tree. Transform trees exist at the coding units. A transform tree may further decompose a coding unit using a quad-tree structure as used for the coding tree. At leaf nodes of the transform tree, residual data is encoded using transform units (TUs). In contrast to the coding tree, the transform tree may subdivide coding units into transform units having a non-square shape. Further, the transform tree structure does not require that transform units (TUs) occupy all of the area provided by the parent coding unit.

Each coding unit at leaf nodes of the coding trees are subdivided into one or more arrays of predicted data samples, each known as a prediction unit (PU). Each prediction unit (PU) contains a prediction of a portion of input video frame data, derived by applying an intra-prediction or an inter-prediction process.

Several methods may be used for coding prediction units (PUs) within a coding unit (CU). A single prediction unit (PU) may occupy an entire area of a coding unit (CU), or the coding unit (CU) may be split into two equal-sized rectangular prediction units (PUs), either horizontally or vertically. Additionally, the coding units (CU) may be split into four equal-sized square prediction units (PUs).

A video encoder compresses the video data into a bitstream by converting the video data into a sequence of syntax elements. A context adaptive binary arithmetic coding (CABAC) scheme is defined within the high efficiency video coding (HEVC) standard under development, using an identical arithmetic coding scheme as to that defined in the MPEG4-AVC/H.264 video compression standard. In the high efficiency video coding (HEVC) standard under development, when context adaptive binary arithmetic coding (CABAC) is in use, each syntax element is expressed as a sequence of bins. Each bin is either bypass-coded or arithmetically coded. Bypass coding is used where the bin is equally likely to be 0 or 1. In this case, there is no further compression achievable. Arithmetic coding is used for bins which have an unequal probability distribution. Each arithmetically coded bin is associated with information known as a 'context'. Contexts contain a likely bin value (the 'valMPS') and a probability state, an integer which maps to an estimated probability of the likely bin value. Creating such a sequence of bins, comprising combinations of bypass-coded bins and arithmetic-coded bins, from a syntax element is known as "binarising" the syntax element.

In a video encoder or video decoder, as separate context information is available for each bin, context selection for bins provides a means to improve coding efficiency. In particular, coding efficiency may be improved by selecting a particular bin such that statistical properties from previous instances of the bin, where the associated context information was used, correlate with statistical properties of a current instance of the bin. Such context selection frequently utilises spatially local information to determine the optimal context.

In the high efficiency video coding (HEVC) standard under development and in H.264/MPEG-4 AVC, a prediction for a current block is derived, based on reference sample data either from other frames, or from neighbouring regions within the current block that have been previously decoded. The difference between the prediction and the desired sample data is known as the residual. A frequency domain representation of the residual is a two-dimensional array of residual coefficients. By convention, the upper-left corner of the two-dimensional array contains residual coefficients representing low-frequency information.

In typical video data, the majority of the changes in sample values are gradual, resulting in a predominance of low-frequency information within the residual. This manifests as larger magnitudes for residual coefficients located in the upper-left corner of the two-dimensional array.

SUMMARY

It is an object of the present invention to substantially overcome, or at least ameliorate, one or more disadvantages of existing arrangements.

According to one aspect of the present disclosure, there is provided a method of decoding a transform unit of encoded video data using Golomb-Rice decoding, the method comprising:

determining significant residual coefficients for a sub-set of the transform unit;

selecting a predetermined Rice parameter for Golomb-Rice decoding of the subset of the transform unit, the predetermined Rice parameter being offset from a zero setting when the determined number of significant residual coefficients is higher than a predetermined threshold; and decoding the subset of the transform unit using the predetermined Rice parameter as an initial parameter for the Golomb-Rice decoding.

According to another aspect of the present disclosure, there is provided an apparatus for decoding a transform unit of encoded video data using Golomb-Rice decoding, the apparatus comprising:

means for determining significant residual coefficients for a sub-set of the transform unit;

means for selecting a predetermined Rice parameter for Golomb-Rice decoding of the subset of the transform unit, the predetermined Rice parameter being offset from a zero setting when the determined number of significant residual coefficients is higher than a predetermined threshold; and means for decoding the subset of the transform unit using the predetermined Rice parameter as an initial parameter for the Golomb-Rice decoding.

According to another aspect of the present disclosure, there is provided a system for decoding a transform unit of encoded video data using Golomb-Rice decoding, the system comprising:

a memory for storing data and a computer program;

a processor coupled to said memory for executing said computer program, said computer program comprising instructions for:

determining significant residual coefficients for a sub-set of the transform unit;

selecting a predetermined Rice parameter for Golomb-Rice decoding of the subset of the transform unit, the predetermined Rice parameter being offset from a zero setting when the determined number of significant residual coefficients is higher than a predetermined threshold; and decoding the subset of the transform unit using the predetermined Rice parameter as an initial parameter for the Golomb-Rice decoding.

According to another aspect of the present disclosure, there is provided a computer readable medium having a computer program recoded thereon for decoding a transform unit of encoded video data using Golomb-Rice decoding, the program comprising:

code for determining significant residual coefficients for a sub-set of the transform unit;

code for selecting a predetermined Rice parameter for Golomb-Rice decoding of the subset of the transform unit, the predetermined Rice parameter being offset from a zero setting when the determined number of significant residual coefficients is higher than a predetermined threshold; and code for decoding the subset of the transform unit using the predetermined Rice parameter as an initial parameter for the Golomb-Rice decoding.

According to another aspect of the present disclosure, there is provided a method of decoding a stream of video data to determine a value of a current residual coefficient in a decoded stream of video data, the method comprising:

receiving a transform unit of residual coefficients from the stream of video data;

determining a position of a current residual coefficient of the transform unit;

decoding the current residual coefficient using dependency free Golomb-rice decoding when the position of the current residual coefficient in the transform unit is greater than a predetermined threshold, wherein the dependency free Golomb-rice uses a predetermined Golomb-Rice value;

decoding the current residual coefficient using dependency based Golomb-rice decoding for the current coefficient when the position of the current residual coefficient in the transform unit is less than the predetermined threshold, wherein the dependency based Golomb-Rice decoding uses a previously decoded residual coefficient value to select a Golomb-Rice value; and determining a value for the current residual coefficient using the selected Golomb-Rice decoding value.

According to another aspect of the present disclosure, there is provided a method of decoding a transform unit of encoded video data using Golomb-Rice decoding, the method comprising:

determining a quantization parameter for the transform unit;

determining significant residual coefficients for a sub-set of the transform unit;

selecting a predetermined Rice parameter for Golomb-Rice decoding of the subset of the transform unit, the predetermined Rice parameter being offset from a zero setting when the determined quantization parameter is lower than a predetermined threshold; and decoding the subset of the transform unit using the predetermined Rice parameter as an initial parameter for the Golomb-Rice decoding.

According to another aspect of the present disclosure, there is provided an apparatus for decoding a transform unit of encoded video data using Golomb-Rice decoding, the apparatus comprising:

means for determining significant residual coefficients for a sub-set of the transform unit;

means for determining a quantization parameter for the transform unit;

means for selecting a predetermined Rice parameter for Golomb-Rice decoding of the subset of the transform unit, the predetermined Rice parameter being offset from a zero setting when the determined quantization parameter is lower than a predetermined threshold; and means for decoding the subset of the transform unit using the predetermined Rice parameter as an initial parameter for the Golomb-Rice decoding.

According to another aspect of the present disclosure, there is provided a system for decoding a transform unit of encoded video data using Golomb-Rice decoding, the system comprising:

a memory for storing data and a computer program;

a processor coupled to said memory for executing said computer program, said computer program comprising instructions for:

determining significant residual coefficients for a sub-set of the transform unit;

determining a quantization parameter for the transform unit;

selecting a predetermined Rice parameter for Golomb-Rice decoding of the subset of the transform unit, the predetermined Rice parameter being offset from a zero setting when the determined quantization parameter is lower than a predetermined threshold; and decoding the subset of the transform unit using the predetermined Rice parameter as an initial parameter for the Golomb-Rice decoding.

According to another aspect of the present disclosure, there is provided a computer readable medium having a computer program recoded thereon for decoding a transform unit of encoded video data using Golomb-Rice decoding, the program comprising:

code for determining significant residual coefficients for a sub-set of the transform unit;

code for determining a quantization parameter for the transform unit;

code for selecting a predetermined Rice parameter for Golomb-Rice decoding of the subset of the transform unit, the predetermined Rice parameter being offset from a zero setting when the determined quantization parameter is lower than a predetermined threshold; and code for decoding the subset of the transform unit using the predetermined Rice parameter as an initial parameter for the Golomb-Rice decoding.

According to another aspect of the present disclosure, there is provided a method of decoding a transform unit of encoded video data using Golomb-Rice decoding, the method comprising:

determining a quantization parameter for the transform unit;

determining a width and a height for the transform unit;

determining significant residual coefficients for a sub-set of the transform unit;

selecting a predetermined Rice parameter for Golomb-Rice decoding of the subset of the transform unit, the predetermined Rice parameter being offset from a zero setting when the determined quantization parameter is lower than or equal to a predetermined threshold, the width is greater than a predetermined threshold and the height is greater than a predetermined threshold; and decoding the subset of the transform unit using the predetermined Rice parameter as an initial parameter for the Golomb-Rice decoding.

According to another aspect of the present disclosure, there is provided an apparatus for decoding a transform unit of encoded video data using Golomb-Rice decoding, the apparatus comprising:

means for determining significant residual coefficients for a sub-set of the transform unit;

means for determining a quantization parameter for the transform unit;

means for determining a width and a height for the transform unit;

means for selecting a predetermined Rice parameter for Golomb-Rice decoding of the subset of the transform unit, the predetermined Rice parameter being offset from a zero setting when the determined quantization parameter is lower than or equal to a predetermined threshold, the width is greater than a predetermined threshold and the height is greater than a predetermined threshold; and means for decoding the subset of the transform unit using the predetermined Rice parameter as an initial parameter for the Golomb-Rice decoding.

According to another aspect of the present disclosure, there is provided a system for decoding a transform unit of encoded video data using Golomb-Rice decoding, the system comprising:

a memory for storing data and a computer program;

a processor coupled to said memory for executing said computer program, said computer program comprising instructions for:

determining significant residual coefficients for a sub-set of the transform unit;

determining a quantization parameter for the transform unit;

determining a width and a height for the transform unit;

selecting a predetermined Rice parameter for Golomb-Rice decoding of the subset of the transform unit, the predetermined Rice parameter being offset from a zero setting when the determined quantization parameter is lower than or equal to a predetermined threshold, the width is greater than a predetermined threshold and the height is greater than a predetermined threshold; and decoding the subset of the transform unit using the predetermined Rice parameter as an initial parameter for the Golomb-Rice decoding.

According to another aspect of the present disclosure, there is provided a computer readable medium having a computer program recoded thereon for decoding a transform unit of encoded video data using Golomb-Rice decoding, the program comprising:

code for determining significant residual coefficients for a sub-set of the transform unit;

code for determining a quantization parameter for the transform unit;

code for determining a width and a height for the transform unit;

code for selecting a predetermined Rice parameter for Golomb-Rice decoding of the subset of the transform unit, the predetermined Rice parameter being offset from a zero setting when the determined quantization parameter is lower than or equal to a predetermined threshold, the width is greater than a predetermined threshold and the height is greater than a predetermined threshold; and code for decoding the subset of the transform unit using the predetermined Rice parameter as an initial parameter for the Golomb-Rice decoding.

Other aspects are also disclosed.

BRIEF DESCRIPTION OF THE DRAWINGS

At least one embodiment of the present invention will now be described with reference to the following drawings, in which:

FIGS. 4A and 4B shows spatial structure of an example transform unit;

FIG. 7 is a schematic block diagram showing syntax element structure of a sub-set of the example transform unit of FIG. 5;

FIG. 9 is a table showing binary representations of residual coefficients with Golomb-Rice code-words;

FIG. 11 is a table showing a lookup table for determining a value of a Golomb-Rice parameter based on the current value of a Golomb-Rice parameter and the value of a previous residual coefficient;

DETAILED DESCRIPTION INCLUDING BEST MODE

Figure 1:
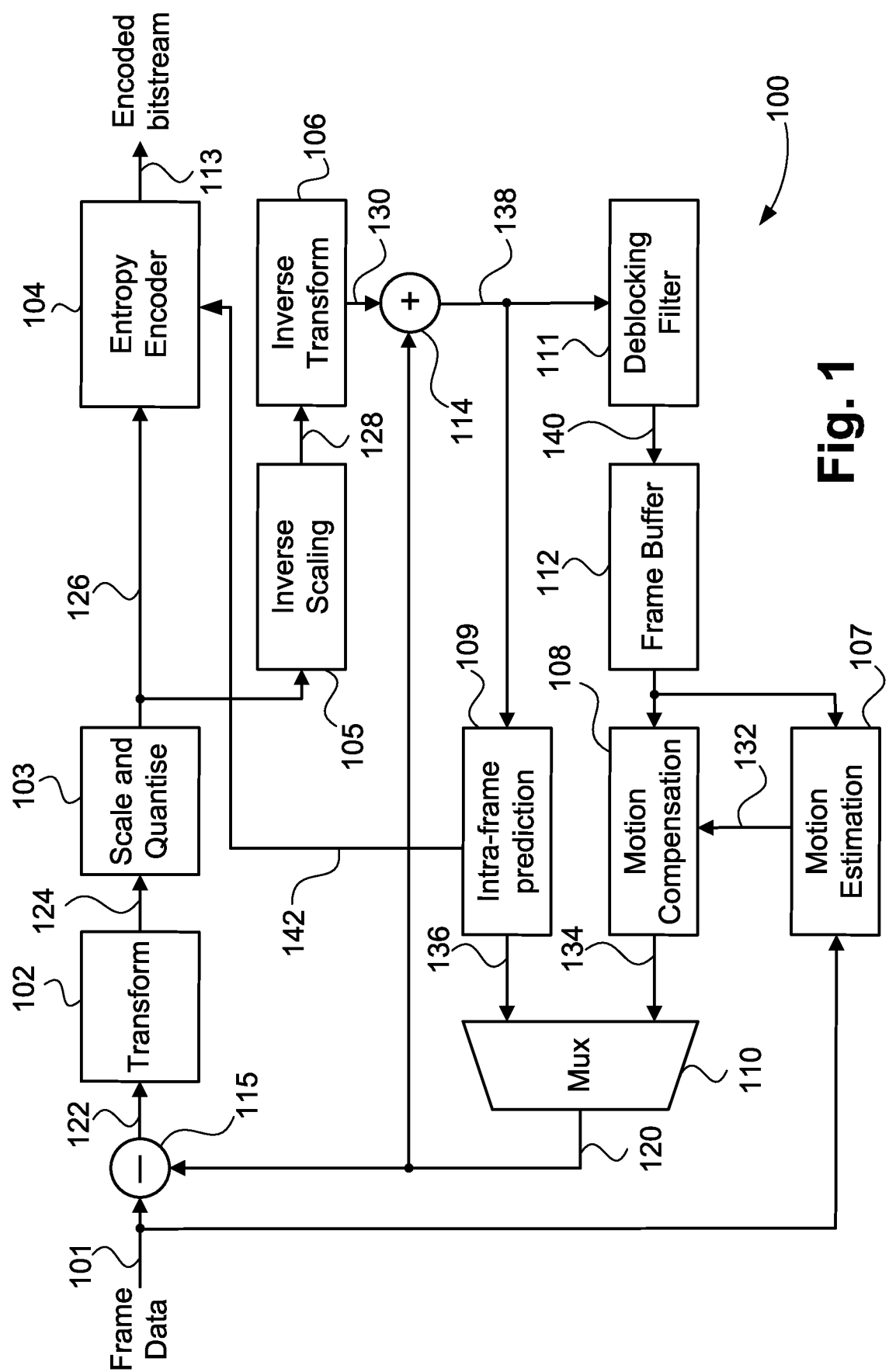
FIG. 1 is a schematic block diagram showing functional modules of a video encoder.

Where reference is made in any one or more of the accompanying drawings to steps and/or features, which have the same reference numerals, those steps and/or features have for the purposes of this description the same function(s) or operation(s), unless the contrary intention appears.

The property of low-frequency information being predominant in the upper-left corner of a two-dimensional array of residual coefficients may be used by a binarisation scheme to minimise the size of the residual coefficients in a bitstream.

One aspect of binarisation is selection of contexts to use for coding syntax elements corresponding to individual flags. One flag may use more than one context. Determining which context should be used for a particular instance of a flag depends on other already available information and is known as 'context modelling'. Context modelling is a process whereby a context that most accurately represents the statistical properties of the present instance of the flag is selected. For example, frequently the value of a flag is influenced by the values of neighbouring instances of the same flag, in which case a context can be selected based on the values of neighbouring instances of the flag. Due to the majority of frame information being contained in the luma channel, context modelling frequently uses separate contexts for the luma channel versus the chroma channels. However, contexts are typically shared between chroma channels, as the statistical properties of the two chroma channels are relatively similar.

Version 6 of the high efficiency video coding (HEVC) test model ("HM-6.0") divides a transform unit (TU) into a number of sub-sets and scans the residual coefficients in each sub-set in two passes. The first pass encodes flags indicating the status of residual coefficients as being non-zero-valued (significant) or zero-valued (non-significant). This data is known as a significance map. A second pass encodes the magnitude and sign of significant residual coefficients, known as the coefficient levels.

A provided scan pattern enables scanning of the two-dimensional array of residual coefficients into a one-dimensional array. In HM-6.0, the provided scan pattern is used for processing both the significance map and the coefficient levels. By scanning the significance map using the provided scan pattern, the location of the last significant coefficient in the two-dimensional significance map may be determined Scan patterns may be horizontal, vertical or diagonal.

HM-6.0 provides support for residual blocks, also known as transform units (TUs) having both a square shape and a non-square shape. Each transform unit (TU) contains a set of residual coefficients. Residual blocks having equally sized side dimensions are known as square transform units (TUs) and residual blocks having unequally sized side dimensions are known as non-square transform units (TUs).

Transform unit (TU) sizes supported in HM-6.0 are 4×4, 8×8, 16×16, 32×32, 4×16, 16×4, 8×32 and 32×8. Transform unit (TU) sizes are typically described in terms of luma-samples. However, when a chroma format of 4:2:0 is used, each chroma sample occupies the area of 2×2 luma samples. Accordingly, scanning transform units (TUs) to encode chroma residual data uses scan patterns of half the horizontal and vertical dimensions, such as 2×2 for a 4×4 luma residual block. For the purpose of scanning and coding the residual coefficients, the 16×16, 32×32, 4×16, 16×4, 8×32 and 32×8 transform units (TUs) are divided into a number of sub-blocks, i.e.: a lower-layer of the transform unit (TU) scan, having a size of 4×4, with a corresponding map existing within HM-6.0.

In HM-6.0, sub-blocks for the above transform unit (TU) sizes are co-located with sub-sets in the transform unit (TU). In another implementation, sub-sets may not be co-located with the sub-blocks having sizes different from the sizes of sub-blocks. The set significant coefficient flags within a portion of the significance map collocated within one sub-block is referred to as a significant coefficient group.

For the 16×16, 32×32, 4×16, 16×4, 8×32 and 32×8 transform units (TUs), the significance map coding makes use of a two-level scan. The upper level scan performs a scan, such as a backward diagonal down-left scan, to code or infer flags representing the significant coefficient groups of each sub-block. Within the sub-blocks, a scan, such as the backward diagonal down-left scan, is performed to code the significant coefficient flags for sub-blocks having a one-valued significant coefficient group flag. For a 16×16 transform unit (TU), a 4×4 upper-level scan is used. For a 32×32 transform unit (TU), an 8×8 upper-level scan is used. For 16×4, 4×16, 32×8 and 8×32 transform unit (TU) sizes, 4×1, 1×4, 8×2 and 2×8 upper-level scans are used respectively.

At each transform unit (TU), residual coefficient data may be encoded into a bit-stream. Each "residual coefficient" is a number representing image characteristics within a transform unit in the frequency (DCT) domain and occupying a unique location within the transform unit. A transform unit is a block of residual data samples that may be transformed between the spatial and the frequency domains. In the frequency domain, the transform unit (TU) encodes the residual data samples as residual coefficient data. Side dimensions of transform units are sized in powers of two (2), ranging from 4 samples to 32 samples for a "Luma" channel, and 2 to 16 samples for a "Chroma" channel. The leaf nodes of the transform unit (TU) tree may contain either a transform unit (TU) or nothing at all, in the case where no residual coefficient data is required.

As the spatial representation of the transform unit is a two-dimensional array of residual data samples, as described in detail below, a frequency domain representation resulting from a transform, such as a modified discrete cosine transform (DCT), is also a two-dimensional array of residual coefficients. The spectral characteristics of typical sample data within a transform unit (TU) are such that the frequency domain representation is more compact than the spatial representation. Further, the predominance of lower-frequency spectral information typical in a transform unit (TU) results in a clustering of larger-valued residual coefficients towards the upper-left of the transform unit (TU), where low-frequency residual coefficients are represented.

Modified discrete cosine transforms (DCTs) or modified discrete sine transforms (DSTs) may be used to implement the residual transform Implementations of the residual transform are configured to support each required transform unit (TU) size. In a video encoder, the residual coefficients from the residual transform are scaled and quantised. The scaling and quantisation reduces the magnitude of the residual coefficients, reducing the size of the data coded into the bit-stream at the cost of reducing the image quality.

After performing the residual transform, a quantization process is performed. The purpose of the quantization process is to achieve a higher compression ratio by reducing the precision of the magnitude of the residual coefficients. This reduction in magnitude precision is a lossy process and thus has an impact on visual quality. The level of precision reduction is controlled by a quantization parameter (QP). The higher the value of the parameter the more visual quality is affected. The quantization parameter maybe modified on transform unit (TU) level by using a delta-qp syntax element as described below.

The high efficiency video coding (HEVC) standard under development is seeking to achieve a high efficiency compression of video data. Estimation and statistical data analysis may be used to achieve high efficiency compression of video data. The high efficiency video coding (HEVC) standard under development is seeking to encode or decode video data at high bit-rates. The context adaptive binary arithmetic coding (CABAC) scheme employed in the high efficiency video coding (HEVC) standard under development supports an 'equal probability' mode of operation referred to as 'bypass coding'. In this mode, a bin is not associated with a context from the context model, and so there is no context model update step. In such a mode, multiple adjacent bins may be read from a bit-stream in parallel, provided each bin is bypass coded which increases throughput. For example, hardware implementations may write/read groups of adjacent bypass coded data in parallel to increase the throughput of encoding/decoding the bit-stream.

Figure 2:
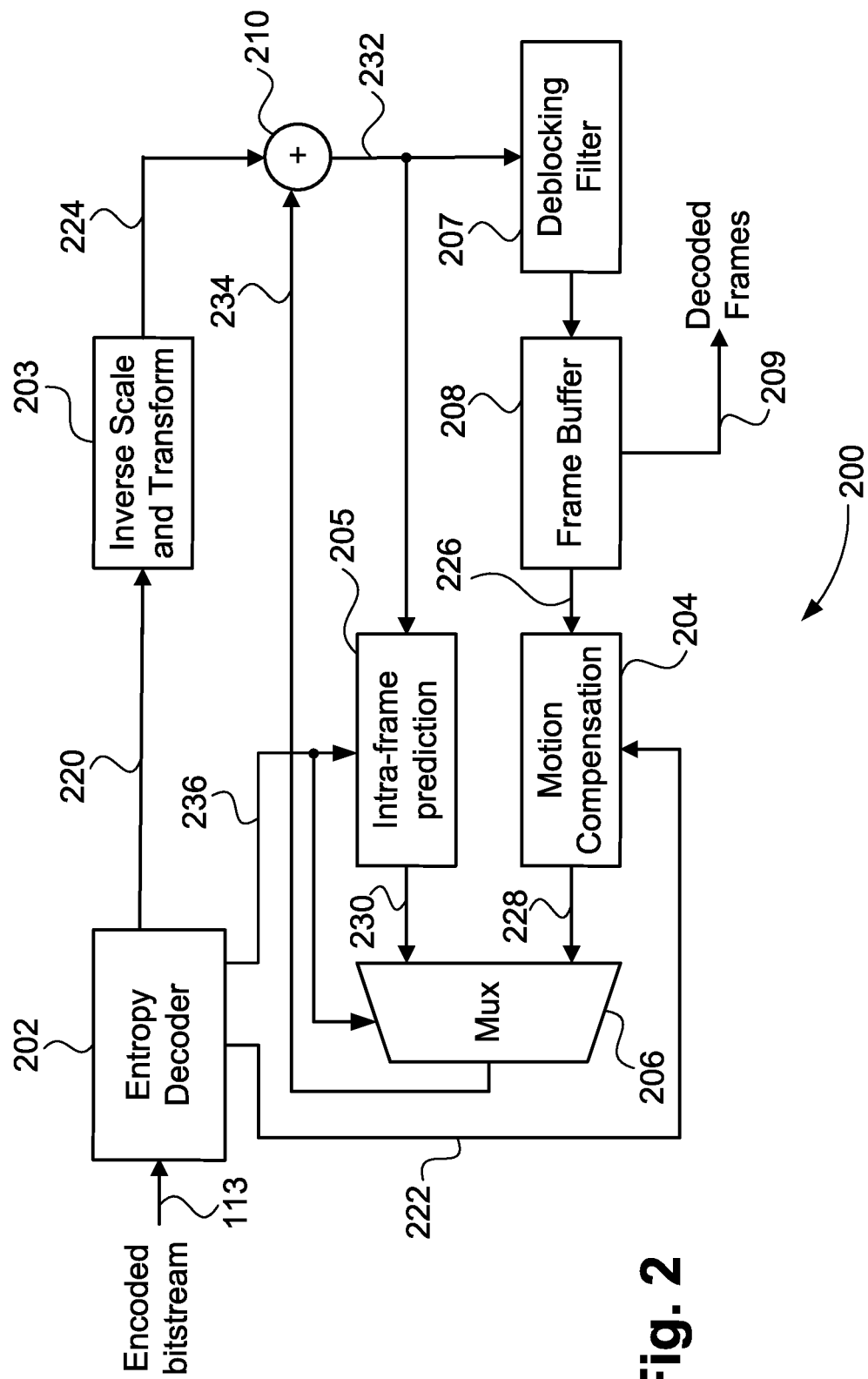
FIG. 2 is a schematic block diagram showing functional modules of a video decoder.

FIG. 1 is a schematic block diagram showing functional modules of a video encoder 100. FIG. 2 is a schematic block diagram showing functional modules of a corresponding video decoder 200. The video encoder 100 and video decoder 200 may be implemented using a general-purpose computer system 300, as shown in FIGS. 3A and 3B where the various functional modules may be implemented by dedicated hardware within the computer system 300, by software executable within the computer system 300, or alternatively by a combination of dedicated hardware and software executable within the computer system 300.

Figure 3A:
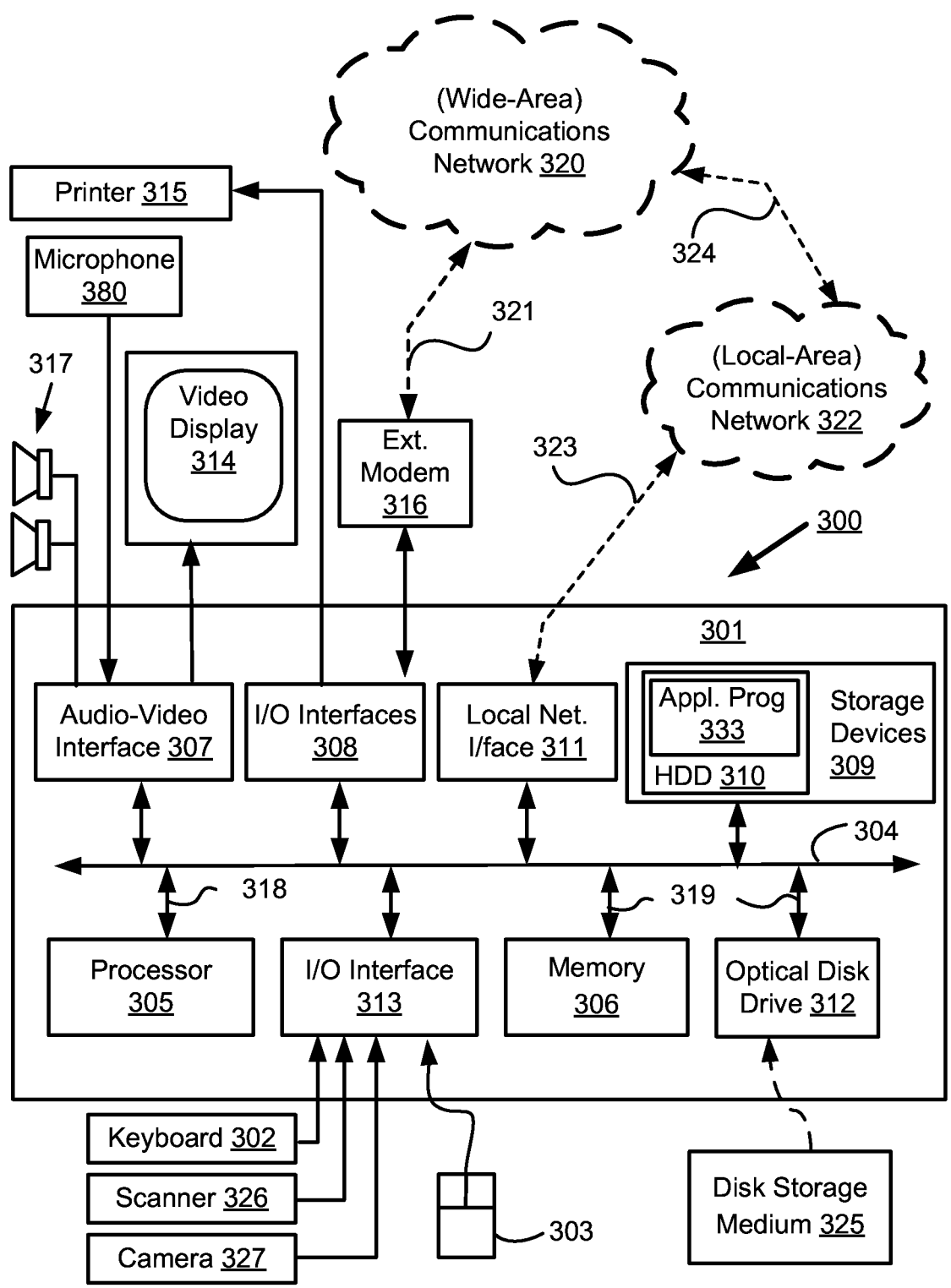
FIGS. 3A and 3B form a schematic block diagram of a general purpose computer system upon which the encoder and decoder of FIGS. 1 and 2, respectively, may be practiced.
Figure 3B:
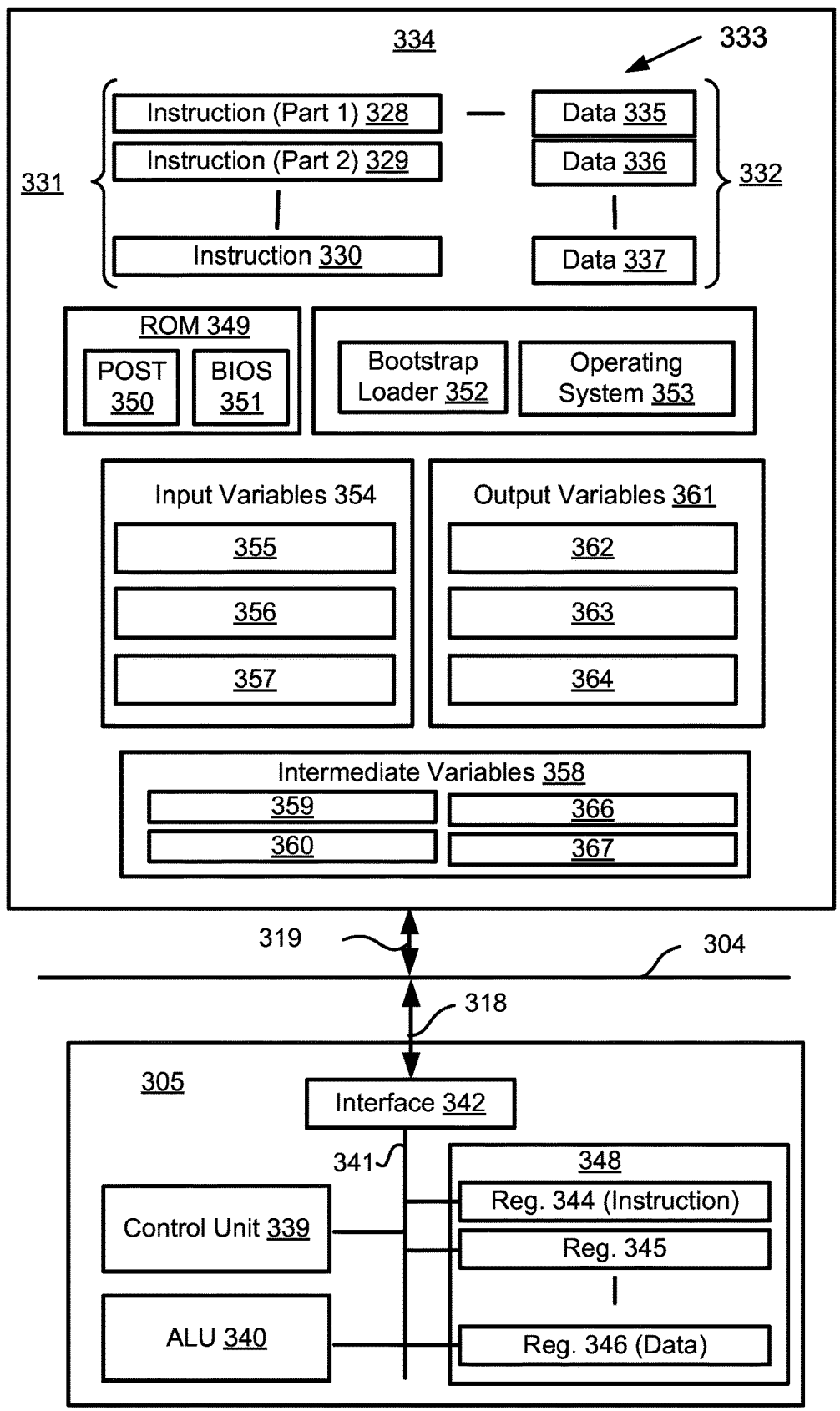

As seen in FIG. 3A, the computer system 300 includes: a computer module 301; input devices such as a keyboard 302, a mouse pointer device 303, a scanner 326, a camera 327, and a microphone 380; and output devices including a printer 315, a display device 314 and loudspeakers 317. An external Modulator-Demodulator (Modem) transceiver device 316 may be used by the computer module 301 for communicating to and from a communications network 320 via a connection 321. The communications network 320 may be a wide-area network (WAN), such as the Internet, a cellular telecommunications network, or a private WAN. Where the connection 321 is a telephone line, the modem 316 may be a traditional "dial-up" modem. Alternatively, where the connection 321 is a high capacity (e.g., cable) connection, the modem 316 may be a broadband modem. A wireless modem may also be used for wireless connection to the communications network 320.

The computer module 301 typically includes at least one processor unit 305, and a memory unit 306. For example, the memory unit 306 may have semiconductor random access memory (RAM) and semiconductor read only memory (ROM). The computer module 301 also includes an number of input/output (I/O) interfaces including: an audio-video interface 307 that couples to the video display 314, loudspeakers 317 and microphone 380; an I/O interface 313 that couples to the keyboard 302, mouse 303, scanner 326, camera 327 and optionally a joystick or other human interface device (not illustrated); and an interface 308 for the external modem 316 and printer 315. In some implementations, the modem 316 may be incorporated within the computer module 301, for example within the interface 308. The computer module 301 also has a local network interface 311, which permits coupling of the computer system 300 via a connection 323 to a local-area communications network 322, known as a Local Area Network (LAN). As illustrated in FIG. 3A, the local communications network 322 may also couple to the wide network 320 via a connection 324, which would typically include a so-called "firewall" device or device of similar functionality. The local network interface 311 may comprise an Ethernet circuit card, a Bluetooth™ wireless arrangement or an IEEE 802.11 wireless arrangement; however, numerous other types of interfaces may be practiced for the interface 311.

The I/O interfaces 308 and 313 may afford either or both of serial and parallel connectivity, the former typically being implemented according to the Universal Serial Bus (USB) standards and having corresponding USB connectors (not illustrated). Storage devices 309 are provided and typically include a hard disk drive (HDD) 310. Other storage devices such as a floppy disk drive and a magnetic tape drive (not illustrated) may also be used. An optical disk drive 312 is typically provided to act as a non-volatile source of data. Portable memory devices, such optical disks (e.g. CD-ROM, DVD, Blu-ray Disc™), USB-RAM, portable, external hard drives, and floppy disks, for example, may be used as appropriate sources of data to the system 300. Typically, any of the HDD 310, optical drive 312, networks 320 and 322, or camera 327 may for a source for video data to be encoded, or, with the display 314, a destination for decoded video data to be stored or reproduced.

The components 305 to 313 of the computer module 301 typically communicate via an interconnected bus 304 and in a manner that results in a conventional mode of operation of the computer system 300 known to those in the relevant art. For example, the processor 305 is coupled to the system bus 304 using a connection 318. Likewise, the memory 306 and optical disk drive 312 are coupled to the system bus 304 by connections 319. Examples of computers on which the described arrangements can be practised include IBM-PC's and compatibles, Sun Sparcstations, Apple Mac or alike computer systems.

Where appropriate or desired, the encoder 100 and the decoder 200, as well as methods described below, may be implemented using the computer system 300 wherein the encoder 100, the decoder 200 and the processes, to be described, may be implemented as one or more software application programs 333 executable within the computer system 300. In particular, the encoder 100, the decoder 200 and the steps of the described methods may be effected by instructions 331 (see FIG. 3B) in the software 333 that are carried out within the computer system 300. The software instructions 331 may be formed as one or more code modules, each for performing one or more particular tasks. The software may also be divided into two separate parts, in which a first part and the corresponding code modules performs the described methods and a second part and the corresponding code modules manage a user interface between the first part and the user.

The software may be stored in a computer readable medium, including the storage devices described below, for example. The software is loaded into the computer system 300 from the computer readable medium, and then executed by the computer system 300. A computer readable medium having such software or computer program recorded on the computer readable medium is a computer program product. The use of the computer program product in the computer system 300 preferably effects an advantageous apparatus for implementing the encoder 100, the decoder 200 and the described methods.

The software 333 is typically stored in the HDD 310 or the memory 306. The software is loaded into the computer system 300 from a computer readable medium, and executed by the computer system 300. Thus, for example, the software 333 may be stored on an optically readable disk storage medium (e.g., CD-ROM) 325 that is read by the optical disk drive 312.

In some instances, the application programs 333 may be supplied to the user encoded on one or more CD-ROMs 325 and read via the corresponding drive 312, or alternatively may be read by the user from the networks 320 or 322. Still further, the software can also be loaded into the computer system 300 from other computer readable media. Computer readable storage media refers to any non-transitory tangible storage medium that provides recorded instructions and/or data to the computer system 300 for execution and/or processing. Examples of such storage media include floppy disks, magnetic tape, CD-ROM, DVD, Blu-ray Disc, a hard disk drive, a ROM or integrated circuit, USB memory, a magneto-optical disk, or a computer readable card such as a PCMCIA card and the like, whether or not such devices are internal or external of the computer module 301. Examples of transitory or non-tangible computer readable transmission media that may also participate in the provision of the software, application programs, instructions and/or video data or encoded video data to the computer module 301 include radio or infra-red transmission channels as well as a network connection to another computer or networked device, and the Internet or Intranets including e-mail transmissions and information recorded on Websites and the like.

The second part of the application programs 333 and the corresponding code modules mentioned above may be executed to implement one or more graphical user interfaces (GUIs) to be rendered or otherwise represented upon the display 314. Through manipulation of typically the keyboard 302 and the mouse 303, a user of the computer system 300 and the application may manipulate the interface in a functionally adaptable manner to provide controlling commands and/or input to the applications associated with the GUI(s). Other forms of functionally adaptable user interfaces may also be implemented, such as an audio interface utilizing speech prompts output via the loudspeakers 317 and user voice commands input via the microphone 380.

FIG. 3B is a detailed schematic block diagram of the processor 305 and a "memory" 334. The memory 334 represents a logical aggregation of all the memory modules (including the HDD 309 and semiconductor memory 306) that can be accessed by the computer module 301 in FIG. 3A.

When the computer module 301 is initially powered up, a power-on self-test (POST) program 350 executes. The POST program 350 is typically stored in a ROM 349 of the semiconductor memory 306 of FIG. 3A. A hardware device such as the ROM 349 storing software is sometimes referred to as firmware. The POST program 350 examines hardware within the computer module 301 to ensure proper functioning and typically checks the processor 305, the memory 334 (309, 306), and a basic input-output systems software (BIOS)module 351, also typically stored in the ROM 349, for correct operation. Once the POST program 350 has run successfully, the BIOS 351 activates the hard disk drive 310 of FIG. 3A. Activation of the hard disk drive 310 causes a bootstrap loader program 352 that is resident on the hard disk drive 310 to execute via the processor 305. This loads an operating system 353 into the RAM memory 306, upon which the operating system 353 commences operation. The operating system 353 is a system level application, executable by the processor 305, to fulfil various high level functions, including processor management, memory management, device management, storage management, software application interface, and generic user interface.

The operating system 353 manages the memory 334 (309, 306) to ensure that each process or application running on the computer module 301 has sufficient memory in which to execute without colliding with memory allocated to another process. Furthermore, the different types of memory available in the system 300 of FIG. 3A must be used properly so that each process can run effectively. Accordingly, the aggregated memory 334 is not intended to illustrate how particular segments of memory are allocated (unless otherwise stated), but rather to provide a general view of the memory accessible by the computer system 300 and how such is used.

As shown in FIG. 3B, the processor 305 includes a number of functional modules including a control unit 339, an arithmetic logic unit (ALU) 340, and a local or internal memory 348, sometimes called a cache memory. The cache memory 348 typically includes a number of storage registers 344-346 in a register section. One or more internal busses 341 functionally interconnect these functional modules. The processor 305 typically also has one or more interfaces 342 for communicating with external devices via the system bus 304, using a connection 318. The memory 334 is coupled to the bus 304 using a connection 319.

The application program 333 includes a sequence of instructions 331 that may include conditional branch and loop instructions. The program 333 may also include data 332 which is used in execution of the program 333. The instructions 331 and the data 332 are stored in memory locations 328, 329, 330 and 335, 336, 337, respectively. Depending upon the relative size of the instructions 331 and the memory locations 328-330, a particular instruction may be stored in a single memory location as depicted by the instruction shown in the memory location 330. Alternately, an instruction may be segmented into a number of parts each of which is stored in a separate memory location, as depicted by the instruction segments shown in the memory locations 328 and 329.

In general, the processor 305 is given a set of instructions which are executed therein. The processor 305 waits for a subsequent input, to which the processor 305 reacts to by executing another set of instructions. Each input may be provided from one or more of a number of sources, including data generated by one or more of the input devices 302, 303, data received from an external source across one of the networks 320, 302, data retrieved from one of the storage devices 306, 309 or data retrieved from a storage medium 325 inserted into the corresponding reader 312, all depicted in FIG. 3A. The execution of a set of the instructions may in some cases result in output of data. Execution may also involve storing data or variables to the memory 334.

The encoder 100, the decoder 200 and the described methods use input variables 354, which are stored in the memory 334 in corresponding memory locations 355, 356, 357. The encoder 100, the decoder 200 and the described methods produce output variables 361, which are stored in the memory 334 in corresponding memory locations 362, 363, 364. Intermediate variables 358 may be stored in memory locations 359, 360, 366 and 367.

Referring to the processor 305 of FIG. 3B, the registers 344, 345, 346, the arithmetic logic unit (ALU) 340, and the control unit 339 work together to perform sequences of micro-operations needed to perform "fetch, decode, and execute" cycles for every instruction in the instruction set making up the program 333. Each fetch, decode, and execute cycle comprises:

(a) a fetch operation, which fetches or reads an instruction 331 from a memory location 328, 329, 330;

(b) a decode operation in which the control unit 339 determines which instruction has been fetched; and (c) an execute operation in which the control unit 339 and/or the ALU 340 execute the instruction.

Thereafter, a further fetch, decode, and execute cycle for the next instruction may be executed. Similarly, a store cycle may be performed by which the control unit 339 stores or writes a value to a memory location 332.

Each step or sub-process in the processes to be described is associated with one or more segments of the program 333 and is typically performed by the register section 344, 345, 347, the ALU 340, and the control unit 339 in the processor 305 working together to perform the fetch, decode, and execute cycles for every instruction in the instruction set for the noted segments of the program 333.

The encoder 100, the decoder 200 and the described methods may alternatively be implemented in dedicated hardware such as one or more integrated circuits performing the functions or sub functions of the described methods. Such dedicated hardware may include graphic processors, digital signal processors, application specific integrated circuits (ASICs), field programmable gate arrays (FPGAs) or one or more microprocessors and associated memories.

As described above, the video encoder 100 may be implemented as one or more software code modules of the software application program 333 resident on the hard disk drive 310 and being controlled in its execution by the processor 305. In particular the video encoder 100 comprises modules 102 to 112, 114 and 115 which may each be implemented as one or more software code modules of the software application program 333.

Although the video encoder 100 of FIG. 1 is an example of a high efficiency video coding (HEVC) video decoding pipeline, processing stages performed by the modules 102 to 112, 114 and 115 are common to other video codecs such as VC-1 or H.264/MPEG-4 AVC. The video encoder 100 receives unencoded frame data 101 as a series of frames including luminance and chrominance samples. The video encoder 100 divides each frame of the frame data 101 into hierarchical sets of coding units (CUs) which may be represented, for example, as a coding unit (CU) tree.

The video encoder 100 operates by outputting, from a multiplexer module 110, an array of predicted data samples known as a prediction unit (PU) 120. A difference module 115 outputs the difference between the prediction unit (PU) 120 and a corresponding array of data samples received from the frame data 101, the difference being known as residual data samples 122.

The residual data samples 122 from the difference module 115 are received by a transform module 102, which converts the difference from a spatial representation to a frequency domain representation to create transform coefficients 124 for each transform unit (TU) in the transform tree. For the high efficiency video coding (HEVC) standard under development, the conversion to the frequency domain representation is implemented using a modified discrete cosine transform (DCT), in which a traditional DCT is modified to be implemented using shifts and additions. The transform coefficients 124 are then input to a scale and quantise module 103 and are scaled and quantised to produce residual coefficients 126. The scale and quantisation process results in a loss of precision.

The residual coefficients 126 are taken as input to an inverse scaling module 105 which reverses the scaling performed by the scale and quantise module 103 to produce rescaled transform coefficients 128, which are rescaled versions of the residual coefficients 126. The residual coefficients 126 are also taken as input to an entropy encoder module 104 which encodes the residual coefficients in an encoded bit-stream 113. Due to the loss of precision resulting from the scale and quantise module 103, the rescaled transform coefficients 128 are not identical to the original transform coefficients 124. The rescaled transform coefficients 128 from the inverse scaling module 105 are then output to an inverse transform module 106. The inverse transform module 106 performs an inverse transform from the frequency domain to the spatial domain to produce a spatial-domain representation 130 of the rescaled transform coefficients 128 identical to a spatial domain representation that is produced at a decoder.

A motion estimation module 107 produces motion vectors 132 by comparing the frame data 101 with previous frame data stored in a frame buffer module 112 configured within the memory 306. The motion vectors 132 are then input to a motion compensation module 108 which produces inter-predicted reference samples 134 by filtering samples stored in the frame buffer module 112, taking into account a spatial offset derived from the motion vectors 132. Not illustrated in FIG. 1, the motion vectors 132 are also passed as syntax elements to the entropy encoder module 104 for coding in the encoded bit-stream 113. An intra-frame prediction module 109 produces intra-predicted reference samples 136 using samples 138 obtained from a summation module 114, which sums the output 120 of the multiplexer module 110 and the output 130 from the inverse transform module 106.

Prediction units (PUs) may be coded using intra-prediction or inter-prediction methods. The decision as to whether to use intra-prediction or inter-prediction is made according to a rate-distortion trade-off between desired bit-rate of the resulting encoded bit-stream 113 and the amount of image quality distortion introduced by either the intra-prediction or inter-prediction method. If intra-prediction is used, one intra-prediction mode is selected from a set of possible modes, also according to a rate-distortion trade-off. One intra-prediction mode is selected for each prediction unit.

The multiplexer module 110 selects either the intra-predicted reference samples 136 from the intra-frame prediction module 109 or the inter-predicted reference samples 134 from the motion compensation block 108, depending on a current prediction mode 142, determined by control logic not illustrated but well-known in the art. The prediction mode 142 is also provided to the entropy encoder 104 and as such is used to determine or otherwise establish the scan order of transform units as will be described. Inter-frame prediction uses only a diagonal scan order, whereas intra-frame prediction may use the diagonal scan, a horizontal scan or a vertical scan order.

The summation module 114 produces a sum 138 that is input to a de-blocking filter module 111. The de-blocking filter module 111 performs filtering along block boundaries, producing de-blocked samples 140 that are written to the frame buffer module 112 configured within the memory 306. The frame buffer module 112 is a buffer with sufficient capacity to hold data from multiple past frames for future reference.

In the video encoder 100, the residual data samples 122 within one transform unit (TU) are determined by finding the difference between data samples of the input frame data 101 and the prediction 120 of the data samples of the input frame data 101. The difference provides a spatial representation of the residual coefficients of the transform unit (TU). The residual coefficients of a transform unit (TU) are converted to the two-dimensional significance map.

The significance map of the residual coefficients in the transform unit (TU) is then scanned in a particular order, known as a scan order, to form a one-dimensional list of flag values, called a list of significant coefficient flags. The scan order may be described or otherwise specified by a scan pattern, such as that received with the prediction mode 142 from the intra-prediction module 109. The scan pattern may be horizontal, vertical, diagonal or zig-zag.

Version 6 of the high efficiency video coding (HEVC) test model (i.e., "HM_6.0") performs scanning in a backward direction. However, scanning in a forward direction is also possible. In the HEVC reference model version 6.0 (i.e., "HM_6.0"), the scan operation starts one residual coefficient after a last significant coefficient (where 'after' is in the direction of a backward scan of the residual coefficients) and progresses until an upper-left location of the significance map is reached. Scan operations having this property and which accord to the HEVC reference model version 6.0 are known as 'backward scans'. In the HEVC reference software version 6.0 (i.e., "HM_6.0"), the location of the last significant coefficient is signalled by encoding co-ordinates of the coefficient in the transform unit (TU). The use of the adjective "last" in this context is dependent upon the particular order of scanning What may be the "last" non-zero residual coefficient or corresponding one-valued significant coefficient flag according to one scan pattern may not be the "last" according to another scan pattern.

The list of significant coefficient flags, indicating the significance of each residual coefficient prior to the last significant coefficient, is coded into the bit-stream. The last significant coefficient flag value is not required to be explicitly encoded into the bit-stream because the prior coding of the location of the last significant coefficient flag implicitly indicates that this residual coefficient was significant.

The clustering of larger-valued residual coefficients towards the upper-left of the transform unit (TU) results in most significance flags earlier in the list being significant, whereas few significance flags are found later in the list.

As described above, the video encoder 100 also comprises an entropy encoder module 104 that implements an entropy encoding method. The entropy encoder module 104 produces syntax elements from incoming residual coefficient data (or residual coefficients) 126 received from the scale and quantise module 103. The entropy encoder module 104 outputs encoded bit-stream 113 and will be described in more detail below. For the high efficiency video coding (HEVC) standard under development, the encoded bit-stream 113 is delineated into network abstraction layer (NAL) units. Each slice of a frame is contained in one NAL unit.

There are several alternatives for the entropy encoding method implemented in the entropy encoder module 104. The high efficiency video coding (HEVC) standard under development supports context adaptive binary arithmetic coding (CABAC), a variant of context adaptive binary arithmetic coding (CABAC) found in H.264/MPEG-4 AVC. An alternative entropy coding scheme is known as the probability interval partitioning entropy (PIPE) coder.

For the video encoder 100 supporting multiple video coding methods, one of the supported entropy coding methods is selected according to the configuration of the encoder 100. Further, in encoding the coding units from each frame, the entropy encoder module 104 writes the encoded bit-stream 113 such that each frame has one or more slices per frame, with each slice containing image data for part of the frame. Producing one slice per frame reduces overhead associated with delineating each slice boundary. However, dividing the frame into multiple slices is also possible.

The video decoder 200 of FIG. 2 may be implemented as one or more software code modules of the software application program 333 resident on the hard disk drive 310 and being controlled in its execution by the processor 305. In particular the video decoder 200 comprises modules 202 to 208 and 210 which may each be implemented as one or more software code modules of the software application program 333. Although the video decoder 200 is described with reference to a high efficiency video coding (HEVC) video decoding pipeline, processing stages performed by the modules 202 to 208 and 209 are common to other video codecs that employ entropy coding, such as H.264/MPEG-4 AVC, MPEG-2 and VC-1.

An encoded bit-stream, such as the encoded bit-stream 113, is received by the video decoder 200. The encoded bit-stream 113 may be read from memory 306, the hard disk drive 310, a CD-ROM, a Blu-ray™ disk or other computer readable storage medium. Alternatively the encoded bit-stream 113 may be received from an external source such as a server connected to the communications network 320 or a radio-frequency receiver. The encoded bit-stream 113 contains encoded syntax elements representing frame data to be decoded.

The encoded bit-stream 113 is input to an entropy decoder module 202 which extracts the syntax elements from the encoded bit-stream 113 and passes the values of the syntax elements to other blocks in the video decoder 200. There may be multiple entropy decoding methods implemented in the entropy decoder module 202, such as those described with reference to the entropy encoder module 104. Syntax element data 220 representing residual coefficient data is passed to an inverse scale and transform module 203 and syntax element data 222 representing motion vector information is passed to a motion compensation module 204. The inverse scale and transform module 203 performs inverse scaling on the residual coefficient data to create reconstructed transform coefficients. The module 203 then performs an inverse transform to convert the reconstructed transform coefficients from a frequency domain representation to a spatial domain representation, producing residual samples 224, such as the inverse transform described with reference to the inverse transform module 106.

The motion compensation module 204 uses the motion vector data 222 from entropy decoder module 202, combined with previous frame data 226 from a frame buffer block 208, configured within the memory 306, to produce inter-predicted reference samples 228 for a prediction unit (PU), being a prediction of output decoded frame data. When a syntax element indicates that the current coding unit was coded using intra-prediction, the intra-frame prediction module 205 produces intra-predicted reference samples 230 for the prediction unit (PU) using samples spatially neighbouring the prediction unit (PU). The spatially neighbouring samples are obtained from a sum 232 output from a summation module 210. The multiplexer module 206 selects intra-predicted reference samples or inter-predicted reference samples for the prediction unit (PU) depending on the current prediction mode, which is indicated by a syntax element in the encoded bit-stream 113. The array of samples 234 output from the multiplexer module 206 is added to the residual samples 224 from the inverse scale and transform module 203 by the summation module 210 to produce the sum 232 which is then input to each of a de-blocking filter module 207 and the intra-frame prediction module 205. In contrast to the encoder 100, the intra-frame prediction module 205 receives a prediction mode 236 from the entropy decoder 202. The multiplexer 206 receives an intra-frame prediction/inter-frame prediction selection signal from the entropy decoder 202. The de-blocking filter module 207 performs filtering along data block boundaries to smooth artefacts visible along the data block boundaries. The output of the de-blocking filter module 207 is written to the frame buffer module 208 configured within the memory 306. The frame buffer module 208 provides sufficient storage to hold multiple decoded frames for future reference. Decoded frames 209 are also output from the frame buffer module 208.

The spatial structure of an example transform unit (TU) 400 will be described with the reference to FIG. 4A and FIG. 4B.

Figure 4A:
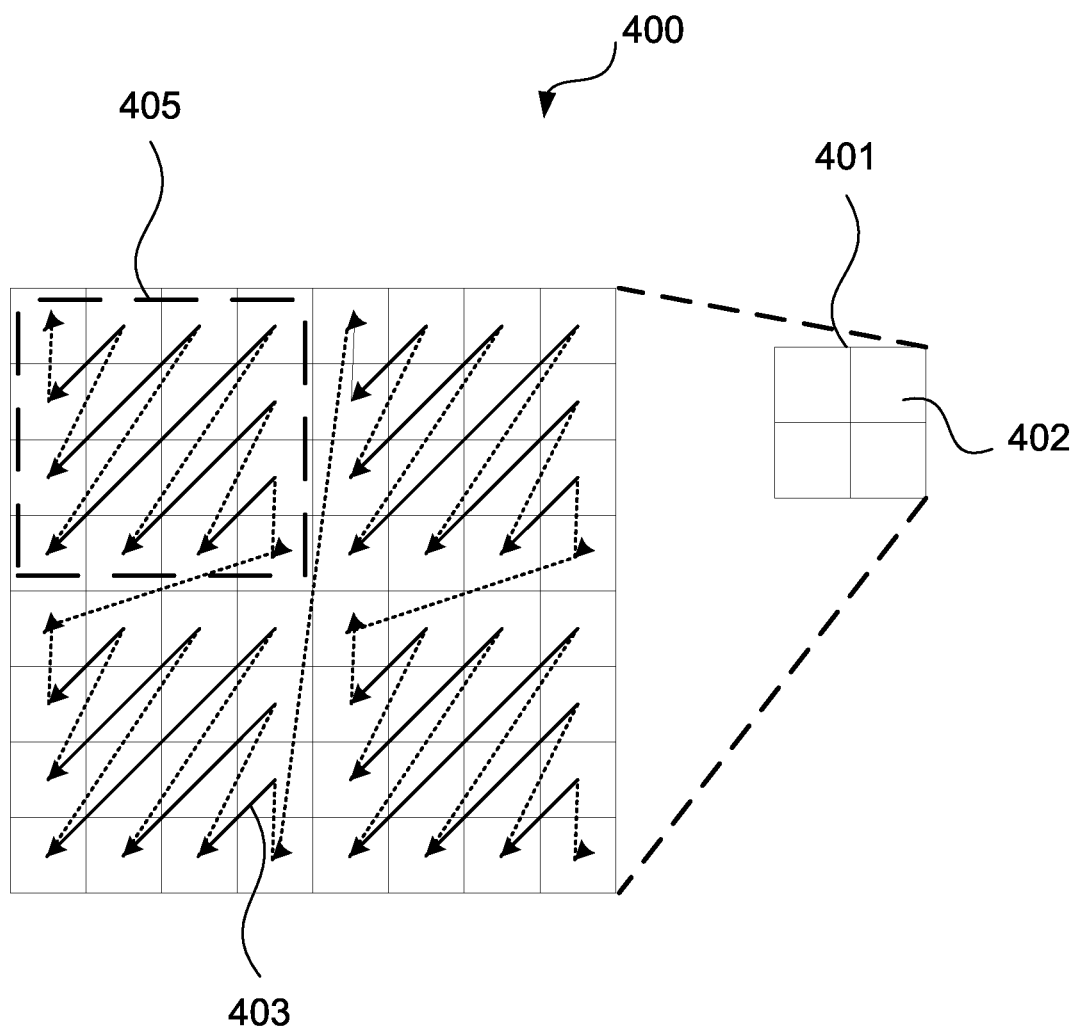
Figure 4B:
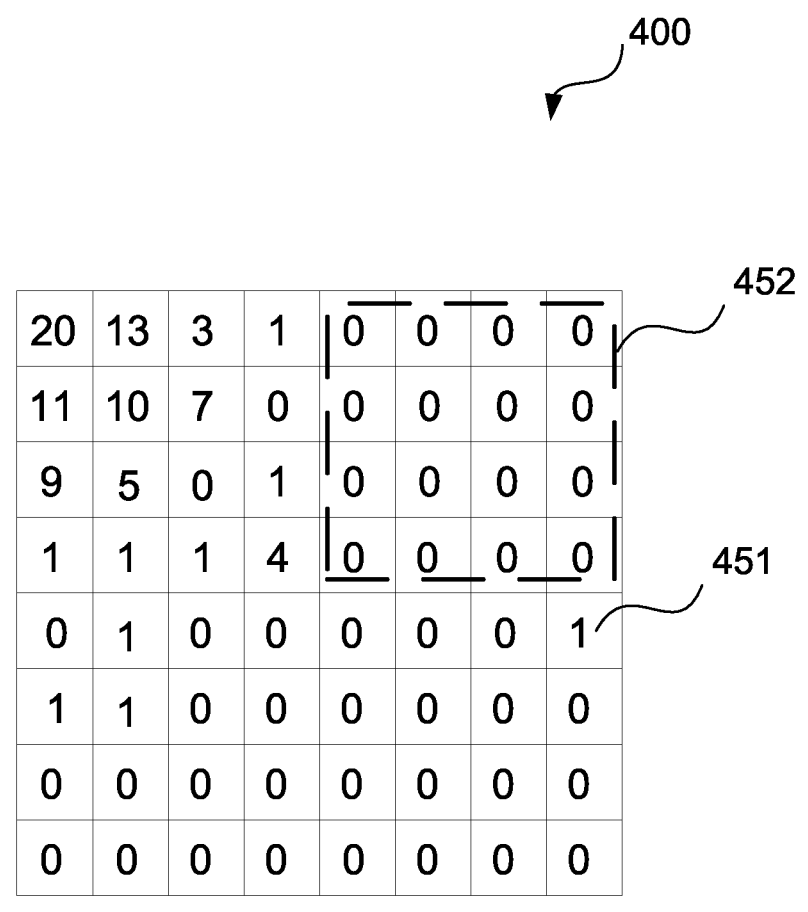

FIG. 4A shows an example transform unit (TU) 400. The transform unit 400 has a rectangular spatial structure and may vary in size from 4×4 to 32×32. Width and height of the transform unit (TU) 400 takes values which are integer powers of two (2).

As described above, transform units (TUs) hold residual coefficients. A two-level scan which divides the transform unit (TU) 400 into a set of one or more sub-sets 401, may be defined. Each sub-set consists of sixteen (16) consecutive residual coefficients in a scan order 403, except the first sub-set in the scan order, which may contain less than sixteen (16) residual coefficients, depending on the position of the last significant coefficient. As seen in FIG. 4B, the example transform unit 400 has a last significant coefficient position 451 with respect to the scan order 403.

As seen in FIG. 4A, at an upper level of the transform unit 400, scanning is performed by scanning each lower-level using a scan, such as the backward diagonal down-left scan. At the lower level of the transform unit 400, also known as the "sub-set level", scanning may be performed using a scan such as the backward diagonal down-left scan. At the upper scan level of the transform unit 400, a decision maybe made to not perform lower-level scanning of the next sub-set if the next sub-set does not contain any significant residual coefficients.

The transform unit 400 contains a sub-set 452 with no significant residual coefficients. In this instance, the lower-level scanning step may be skipped for the sub-set 452 and high-level scanning proceeds to a next sub-set in the scan order 403. The upper left sub-set 405 of the transform unit 400 has sub-set index zero. Other sub-sets have incrementing indexes in the order opposite to the scan order.

Figure 5:
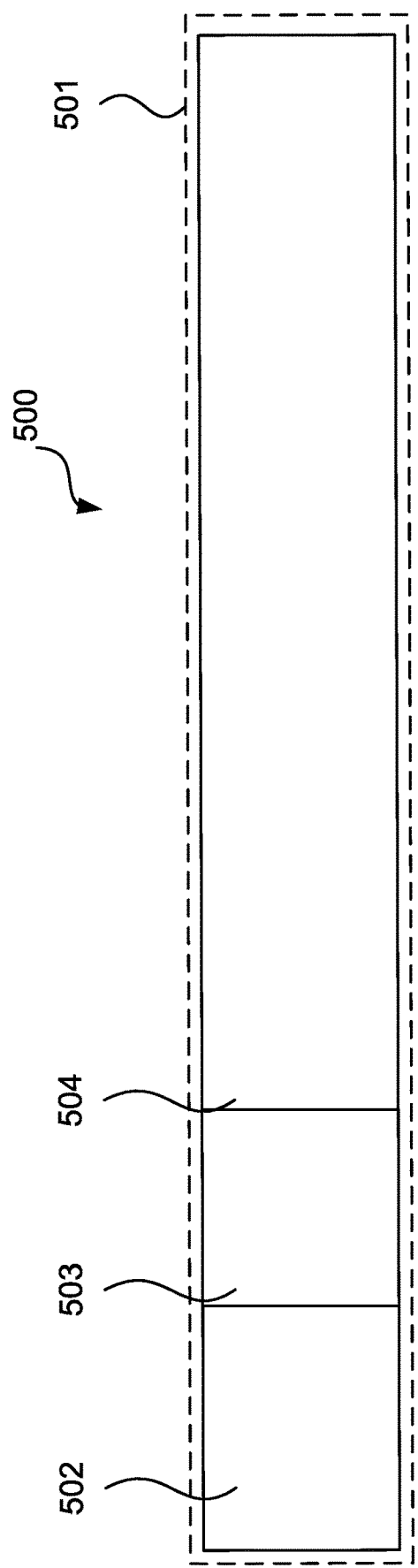
FIG. 5 is a schematic block diagram showing syntax element structure of an example transform unit.

Syntax element structure of a transform unit (TU), such as the transform unit (TU) 400, will be described with the reference to FIG. 5 and FIG. 7. A bit-stream portion 501 of the bit-stream 113 contains syntax elements of transform unit (TU) 400 and consists of the following syntax elements:

(i) delta_502: The delta_qp syntax element 502 contains information about a difference between a quantization parameter value used to quantize the transform unit (TU) 400 and a predetermined quantization parameter value.

(ii) last_significant_xy 503: The last_significant_xy syntax element 503 contains information about a position of the last significant residual coefficient in the transform unit (TU) 400.

(iii) sub-set residual coefficient data 504: The sub-set residual coefficient data consists of zero or more blocks 701 and contains information about the values of the residual coefficients of the transform unit (TU) 400.

As seen in FIG. 7, a block 701 contains information about the values of the residual coefficients of a single sub-set of a transform unit (TU) and consists of the following syntax elements:

(i) significant_coeff_group_flag 702: The significant_coeff_group_flag syntax element 702 is coded once per sub-set and when false, all residual coefficients in the sub-set are inferred to be zero and the residual coefficient data 703, 704, 705 706 and 707 is absent from the block701. Otherwise (when the significant_ceoff_group_flag syntax element 702 is true), at least one residual coefficient in the sub-set has a non-zero value and some combination of residual coefficient data 703, 704, 705, 706 and 707 is present in the block 701.

(ii) a block 703 of zero or more significant_coeff_flag values: The block 703 is present if the significant_coeff_group_flag 702 indicates presence of the block 703. Values of the significant_coeff_flag 702 are present in the block 703 for every residual coefficient of the sub-set except the last significant residual coefficient to indicate whether the magnitude of a given residual coefficient is greater than zero.

(iii) a block 704 of zero or more coeff_abs_level_greater1_flag values: The block 704 is present if the significant_coeff_group_flag 702 indicates presence of the block 704. The coeff_abs_level_greater1_flag values are present in the block 703, for every residual coefficient of the sub-set for which magnitude was indicated to be greater than zero, to indicate whether the magnitude of a given residual coefficient is greater than one.

(iv) a block 705 of zero or more coeff_abs_level_greater2_flag values: The block 705 is present if the significant_coeff_group_flag 702 indicates presence of the block 705. The coeff_abs_level_greater2_flag values are present in the block 705, for every residual coefficient of the sub-set for which the magnitude was indicated to be greater than one, to indicate whether the magnitude of a given residual coefficient is greater than two.

(v) a block 706 of zero or more coeff_sign_flag values: The block 706 is present if the significant_coeff_group_flag 702 indicates presence of the block 706. The coeff_sign_flag values are present in the block 706, for every residual coefficient for which the magnitude was indicated to be greater than zero, to indicate the arithmetic sign of a given residual coefficient.

(vi) a block 707 of zero or more coeff_abs_level_remaining values: Each coeff_abs_level_remaining value of the block 707 is a Golomb-Rice code-word for a given value of the residual coefficient magnitude minus three (i.e., the remaining residual coefficient magnitude). The block 707 is present if the significant_coeff_group_flag 702 indicates presence of the block 707. The coeff_abs_level_remaining values are present in the block 707 for each residual coefficient for which the magnitude was indicated to be greater than two. The coeff_abs_level_remaining values specify the value of the Golomb-Rice code-word for the remaining residual coefficient magnitude of a given residual coefficient.

Figure 6A:
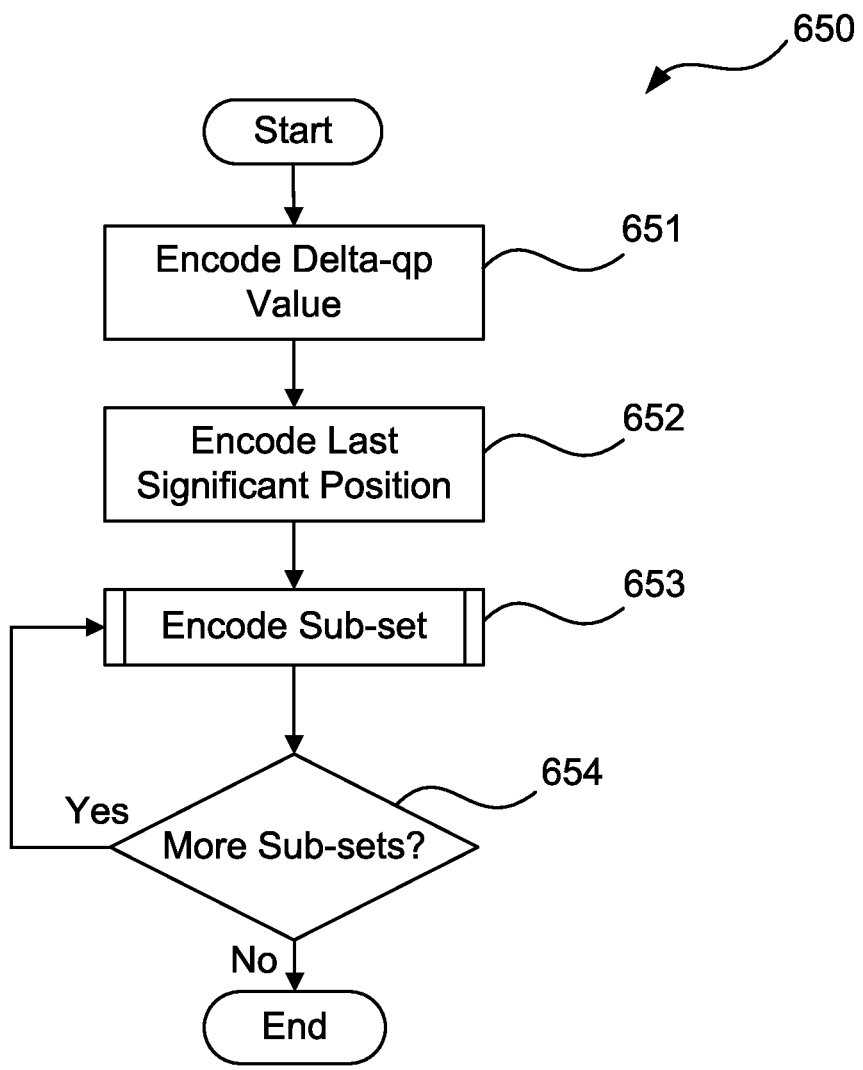
FIG. 6A is a schematic block diagram showing a method of encoding a transform unit (TU)

A method 650 of encoding a transform unit (TU) will now be described with reference to FIG. 6A. The method 650 may be implemented as part of the entropy encoder modules 104 of the encoder 100. As described above, the software code modules 102 to 112, 114 and 115 forming the encoder 100 are resident on the hard disk drive 310 and are controlled in their execution by the processor 305.

The method 650 will be described by way of example with reference to the bit-stream portion 501 of FIG. 5. The method 650 encodes the delta_qp 502, the last_significant_xy503 and the data 504 into the bit-stream portion 501.

The method 650 begins at encode delta-qp value step 651, where a delta-qp value is encoded by the encoder module 104, under execution of the processor 305, and stored in the memory 306.

Then at encode last significant position step 652, the position of the last significant residual coefficient is encoded into the bit-stream portion 501 by the encoder module 104, under execution of the processor 305. The bit-stream portion 501 may be stored in the memory 306. The position of the last significant residual coefficient, width and height of the transform unit and information about scan order 403 are used to determine the number of sub-sets to be encoded in the transform unit (TU).

The method 650 continues at an encode sub-set step 653, where the sub-set data 504 is encoded by the encoder module 104 and stored within the memory 306.

Then at decision step 654,*the* encoder module 104 determines whether more sub-sets 504 should be encoded into the bit-stream portion 501, based on the information about the position of the last significant residual coefficient in the transform unit (TU) and scan order 403 used. If the encoder module 104 determines that there are more sub-sets 504 to be encoded, then the method 650 returns to encode sub-set step 653. As such, the method 650 iterates over steps 653 and 654 until all sub-sets from the sub-set containing the last significant coefficient to the first sub-set have been processed. Otherwise, the method 650 concludes.

Figure 6B:
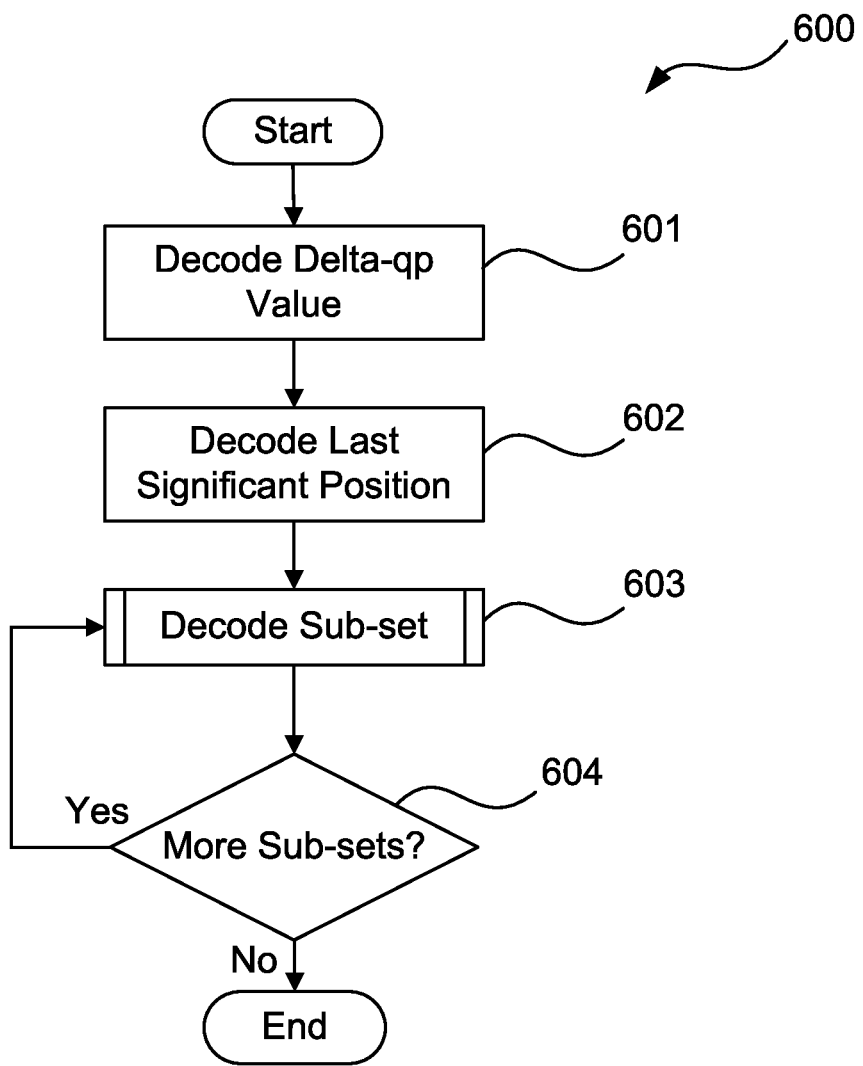
FIG. 6B is a schematic flow diagram showing a method of decoding a transform unit (TU)

A method 600 of decoding a transform unit (TU) will be described with reference to FIG. 6B. The method 600 may be implemented as part of the entropy decoder module 202 of the decoder 200. As described above, the software code modules 202 to 208 and 210 forming the decoder 200 are resident on the hard disk drive 310 and are controlled in their execution by the processor 305.

Again, the method 600 will be described by way of example with reference to the bit-stream portion 501 of FIG. 5 encoded in accordance with the method 650. The method 600 decodes data blocks 502, 503, 504 from the bit-stream portion 501.

The method begins at decode delta-qp value step 601, where a value of delta-qp flag is determined by the decoder module 202 under execution of the processor 305. The delta-qp flag value may be stored in the memory 306.

Then at decode last significant position step 602, the position of the last significant residual coefficient in the transform unit (TU) is determined by the decoder module 202. The position of the last significant residual coefficient, width and height of the transform unit and information about scan order 403 are used to determine the number of sub-sets to be decoded in the transform unit (TU).

The method 600 continues at decode sub-set step 603, where the sub-set data 504 is decoded by the decoder module 202 under execution of the processor 305. The decoded sub-set data may be stored within the memory 306.

Then at decision step 604, the decoder module 202 determines whether more sub-sets 504 should be decoded from the bit-stream portion 501 based on the information about the position of the last significant residual coefficient in the transform unit (TU) and used scan order 403.

If the decoder module 202 determines that there are more sub-sets 504 to be decoded, then the method 600 returns to sub-set step 603. Otherwise, the method 600 concludes.

Figure 8A:
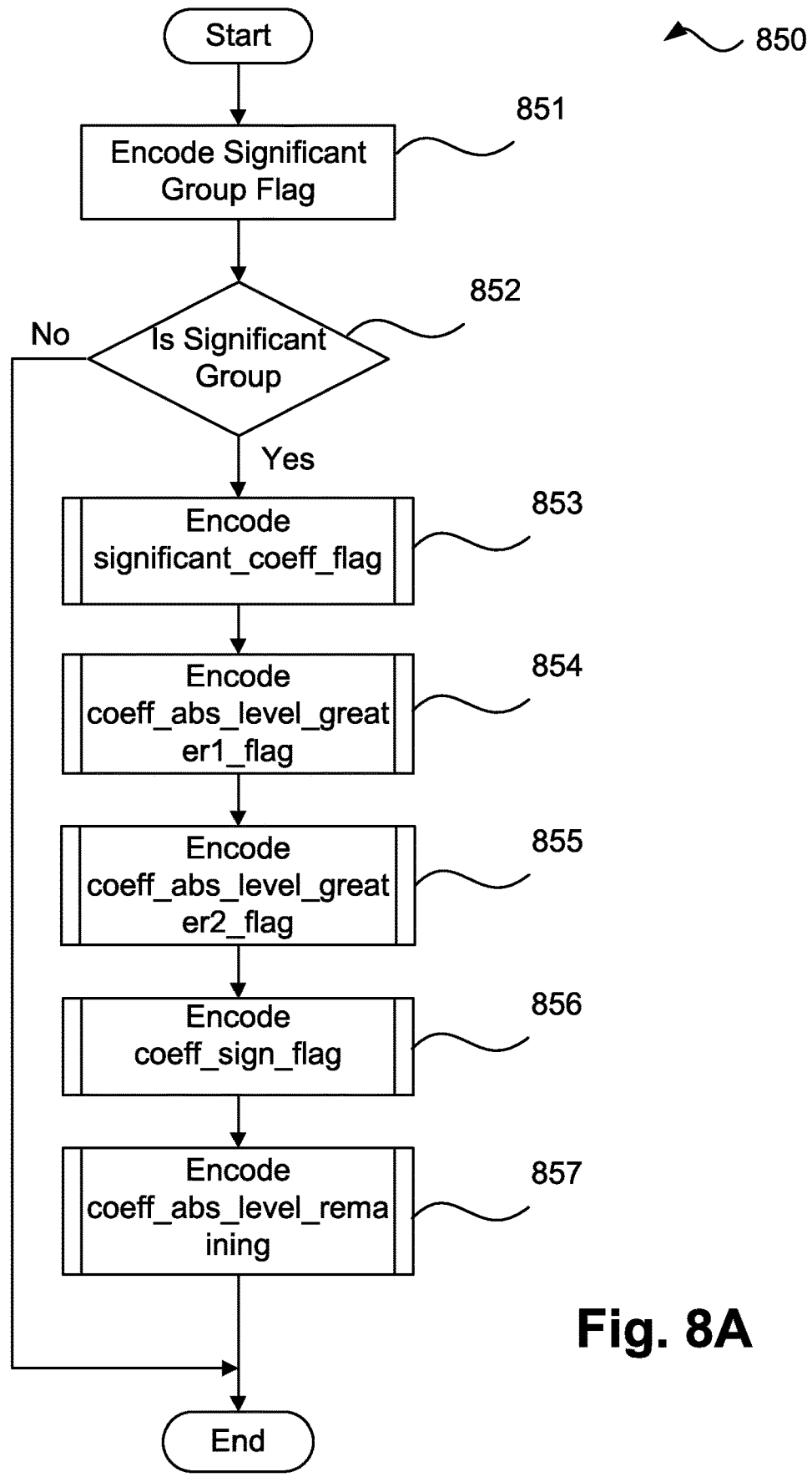
FIG. 8A is a schematic flow diagram showing a method of encoding a sub-set of a transform unit.

A method 850 of encoding a sub-set of a transform unit (TU) will now be described with the reference to FIG. 8A. The method 850 may be implemented as part of the entropy encoder module 104 of the encoder 100. As described above, the software code modules 102 to 112, 114 and 115 forming the encoder 100 are resident on the hard disk drive 310 and are controlled in their execution by the processor 305.

The method 850 will be described by way of example with reference to the block 701 of FIG. 7. The method 850 encodes the blocks 702, 703, 704, 705, 706, 707 into the bit-stream portion 501.

The method 850 begins at encodes significant group flag step 851 where the encoder module 104, under execution of the processor 305, encodes a value of the significant_coeff_group_flag 702 and stores the encoded value in the memory 306.

Then at step 852, if the value of the significant_coeff_group_flag 702 indicates that the sub-set contains the data to be encoded for blocks 703, 704, 705 706, 707 the method 850 proceeds to step 853. Otherwise, the method 850 concludes.

At encoding step 853, the encoder module 104, under execution of the processor 305, encodes the block 703 of significant_coeff_flag values. The encoder module 104 determines one significant_coeff_flag value for each residual coefficient of the sub-set except the last significant residual coefficient of the transform unit (TU). The significant_coeff_flag values may be stored in the memory 306.

Then at encoding step 854, the encoder module 104 encodes the block 704 of coeff_abs_level_greater1_flag values. The encoder module 104 determines one coeff_abs_level_greater1_flag value for each residual coefficient of the sub-set with the magnitude greater than zero. The encoded coeff_abs_level_greater1_flag values may be stored in the memory 306.

At encoding step 855, the encoder module 104 encodes the block 705 of coeff_abs_level_greater2_flag values. The encoder module 104 determines one coeff_abs_level_greater2_flag value for each residual coefficient of the sub-set with a magnitude greater than one. The encoded coeff abs_level_greater2_flag values may be stored in the memory 306.

Then at encoding step 856, the encoder module 104, under execution of the processor 305, encodes the block 706 of coeff_sign_flag values. The encoder module 104 determines one coeff_sign_flag value for each residual coefficient of the sub-set with the magnitude greater than zero. The encoded coeff_sign_flag values may be stored in the memory 306.

At encoding step 857, the encoder module 104 encodes the block 707 of coeff_abs_level_remaining values. The encoder module 104 determines one coeff_abs_level_remaining value for each residual coefficient of the sub-set with the magnitude greater than two. The encoded coeff_abs_level_remaining values may be stored in the memory 306. After step 857, the method 850 concludes.

Figure 8B:
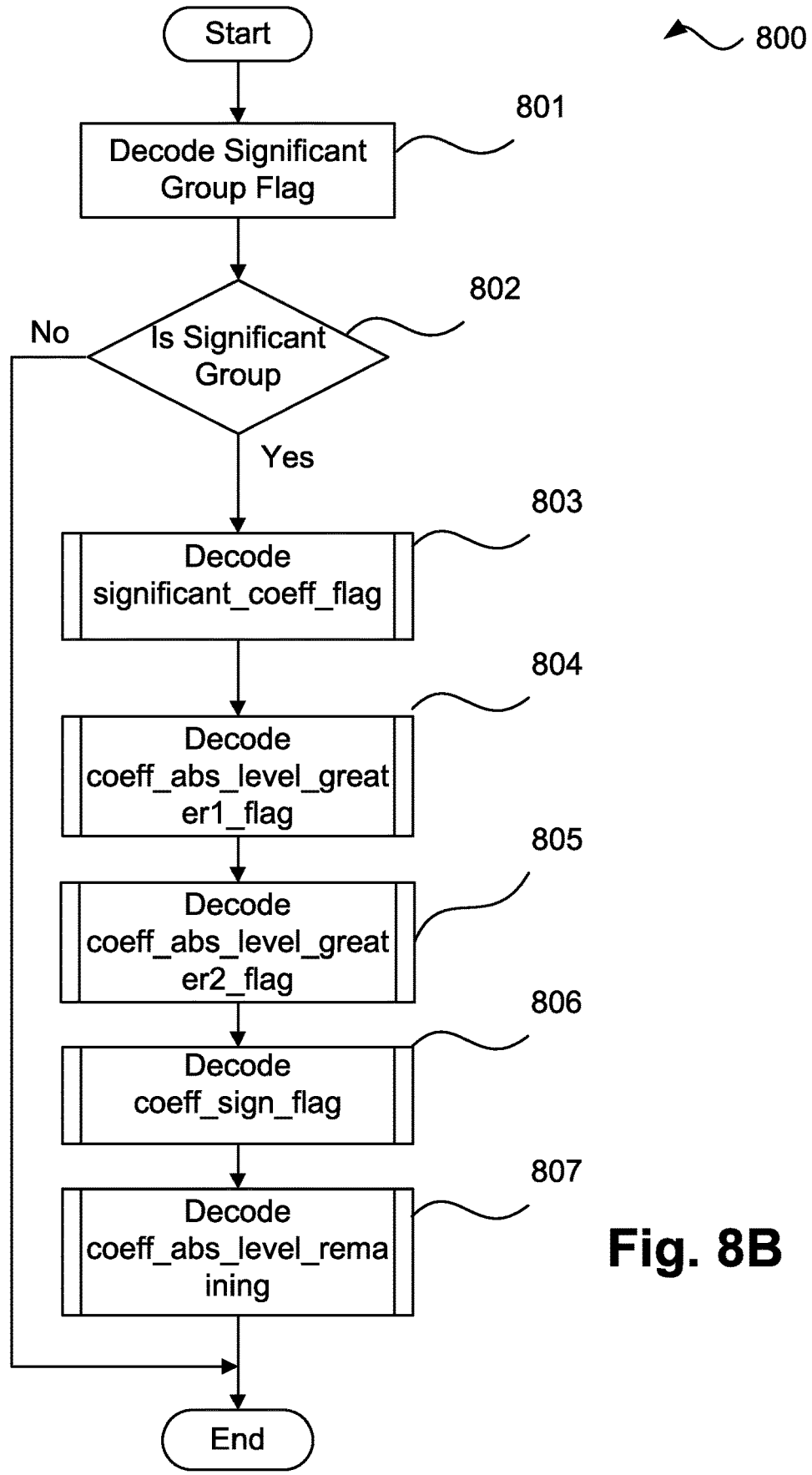
FIG. 8B is a schematic flow diagram showing a method of decoding a sub-set of a transform unit.

A method 800 of decoding a sub-set of a transform unit (TU) will be described with the reference to FIG. 8B. The method 800 may be implemented as part of the entropy decoder module 202 of the decoder 200. As described above, the software code modules 202 to 208 and 210 forming the decoder 200 are resident on the hard disk drive 310 and are controlled in their execution by the processor 305.

The method 800 will be described by way of example with reference to the block 701 of FIG. 7. The method 800 decodes the blocks 702, 703, 704, 705, 706, 707 from the bit-stream portion 501.

The method 800 begins at decode significant group flag step 801, where the decoder module 202 decodes a value of the significant_coeff_group_flag 702. The decoded significant_coeff_group_flag 702 value may be stored in the memory 306.

Then at step 802, if the decoder module 202 determines that the value of the significant_coeff_group_flag 702 indicates that the sub-set contains the residual coefficient data blocks 703, 704, 705, 706, 707 the method 800 proceeds to step 803. Otherwise, the method 800 concludes.

At decoding step 803, the decoder module 202, under execution of the processor 305, decodes the block 703 of significant_coeff_flag values. The decoder module 202 determines one significant_coeff_flag value for each residual coefficient of the sub-set except the last significant residual coefficient of the transform unit (TU). The decoded significant_coeff_flag values may be stored in the memory 306.

Then at decoding step 804, the decoder module 202 decodes the block 704 of coeff_abs_level_greater1_flag values. The decoder module 202 determines one coeff_abs_level_greater1_flag value for each residual coefficient of the sub-set for which one the magnitude was determined at step 803 to be greater than zero. The decoded coeff_abs_level_greater1_flag values may be stored in the memory 306.

At decoding step 805, the decoder module 202, under execution of the processor 305, decodes the block 705 of coeff_abs_level_greater2_flag values. The decoder module 202 determines one coeff_abs_level_greater2_flag value for each residual coefficient of the sub-set for which the magnitude was determined at step 804 to be greater than one. The decoded coeff_abs_level_greater2_flag values may be stored in the memory 306.

Then at decoding step 806, the decoder module 202 decodes the block 706 of coeff_sign_flag values. The decoder module 202 determines one coeff_sign_flag value for every residual coefficient of the sub-set for which the magnitude was determined at step 803 to be greater than zero. The coeff_sign_flag values may be stored in the memory 306.

The method 800 concludes at step 807, where the decoder module 202 decodes the block 707 of coeff_abs_level_remaining values. The decoder module 202 determines one coeff_abs_level_remaining value for each residual coefficient of the sub-set for which the magnitude was determined at step 805 to be greater than two. Also at step 807, the decoder module 202 determines the value of a Golomb-Rice code-word for the remaining residual coefficient magnitude of a given residual coefficient.

Following step 807, the method 800 concludes.

Parameterized Golomb-Rice codes and their use in the HEVC reference model version 6.0 and the methods described herein, will now be described with the reference to FIG. 9, FIG. 10, FIG. 14A and FIG. 14B.

Parameterized Golomb-Rice codes are a class of universal prefix binary codes used to represent the remaining residual coefficient magnitude values of residual coefficients of a transform unit (TU). A prefix binary code is a binary value representation where every binary code-word has a unique prefix. Such a unique prefix allows a particular code-word to be distinguished from other code-words which is necessary to uniquely identify the values represented by the code-words.

Each code-word of a parameterized Golomb-Rice code may consist of two parts: a parameterized truncated-Rice prefix part and possibly an empty order-0-exponential-Golomb suffix part. The truncated-Rice prefix part depends on a parameter K which may take values 0, 1, 2, 3, 4. For every value of the parameter K there is defined a threshold. If the encoded value of residual coefficient remaining magnitude is less than the threshold then the value is encoded with a truncated-Rice code without an exponential-Golomb suffix.

If the encoded value of the residual coefficient remaining magnitude is equal to or greater than the threshold then a predetermined truncated-Rice code-word is encoded to indicate that the encoded value is equal to or greater than the threshold. Further, a value equal to the original encoded value minus the value of the threshold is encoded using an order-0-exponential-Golomb code.

Table 900, as seen in FIG. 9, contains example truncated-Rice code-words for values 0 to 15 and parameter K values 0 and 1.

Figure 10:
FIG. 10 is a table showing binary representations of residual coefficients with exponential Golomb code-words of order zero.

Table 1000, as seen in FIG. 10, contains example order-0-exponential-Golomb code-words. For example, using the Golomb-Rice code with parameter K=0 the value ten (10) will be represented with the truncated-Rice prefix "11111111" and order-0-exponential-Golomb suffix "110" forming Golomb-Rice code-word "11111111110". When the value of the parameter K is known, a Golomb-Rice code-word may be uniquely identified from a given binary sequence.

Every code-word of parameterized Golomb-Rice code has a fixed length which depends on the parameter K and the encoded value. A limited number of code-words may have a given length. As such, for a set of encoded values, some encoded values are represented with shorter code-words while other encoded values will be represented with longer code-words. For video data encoding, the code-words may be allocated to the encoded values so as to minimize a total length of all the code-words encoded into the bit-stream 113. Different remaining residual coefficient magnitude values have a different frequency of appearance in the transform unit (TU) data. A reduction of the total code-word length maybe achieved by assigning code-words to the encoded values so that the length of the code-word corresponds to the frequency of appearance of the encoded value. For example, more frequent values of residual coefficient remaining magnitude may be assigned shorter code-words, the values of residual coefficient remaining magnitude with the same frequency may be assigned code-words of the same length.

The parameter K of parameterized Golomb-Rice code allows the distribution of code-word length among the code-words to be controlled. The smaller values of the parameter K allocate more optimal code-words to values with smaller magnitudes while the larger values of the parameter K allocate more optimal code-words to values with larger magnitudes. Therefore, in order to allocate optimal code-words in general, the described methods determine the value of the parameter K based on the frequency of appearance of a given value of residual coefficient remaining magnitude.

In the HEVC standard under development, the true frequencies of the residual coefficient remaining magnitude values such as the values of the remaining residual coefficients magnitude are not known in advance so an estimation of the parameter K value is performed within a subset. To ensure correct decoding of parameterized Golomb-Rice code-words the encoder 100 and decoder 200 may be configured to use the same value of the parameter K to decode a particular code-word. As such, estimation of the frequency value is limited to the information available at the decoder 200.

The estimation of the frequency value may consist of two phases: initial estimation and adaptation.

The initial estimation phase provides an initial estimated value for the parameter K. The adaptation phase provides further corrections to the value of the parameter K as values of the remaining residual coefficients magnitude are being decoded and more information becomes available for the analysis.

Initial estimation ensures more optimal code-word allocation. On the other hand, the initial estimation is usually hard to implement in an efficient way as prior to decoding no information about the values of the remaining residual coefficients magnitude is available. An efficient method of initially determining an estimation of the parameter K may provide considerable improvements in coding efficiency.

During the initial estimation of the parameter K it is possible to detect the cases where further adaptation will have no significant impact on the value of the parameter K and therefore can be skipped. The adaptation phase improves encoding efficiency in general. However, for a wide class of practical cases the adaptation is redundant because the initial estimation provides an optimal value of the parameter K and further adaptation is not needed. One disadvantage of the adaptation phase is that the consecutive values of the coeff_abs_level_remaining value cannot be decoded in parallel because each value cannot be decoded without knowing the value of the parameter K which is estimated adaptively after decoding of the previous coeff_abs_level_remaining value.

Figure 12A:
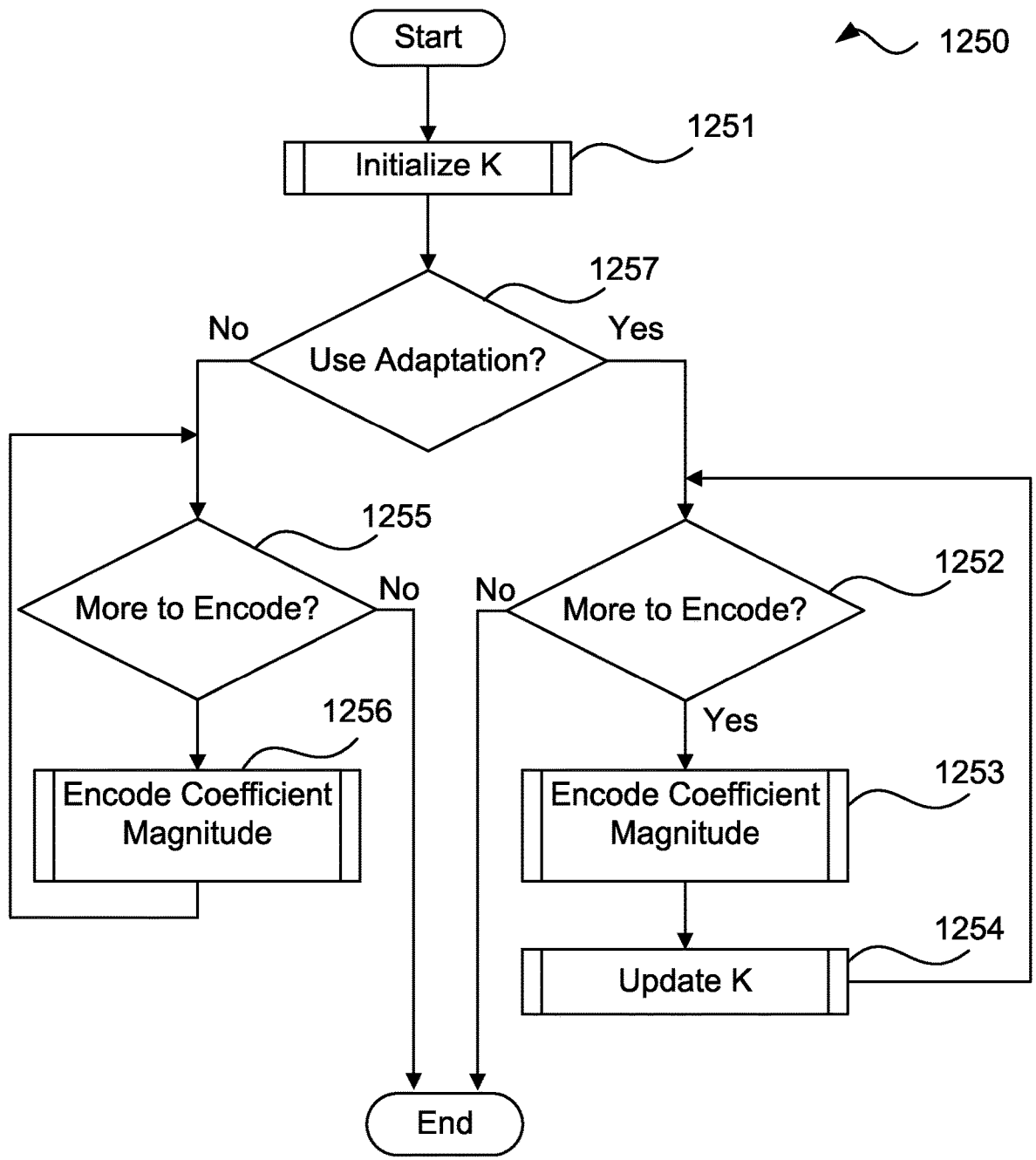
FIG. 12A is a schematic flow diagram showing a method of encoding a residual coefficient.

A method 1250 of encoding a block of coeff_abs_level_remaining values of a sub-set of a transform unit (TU) will now be described with the reference to FIG. 11 and FIG. 12A.

The method 1250 may be implemented as part of the entropy encoder module 104 of the encoder 100. As described above, the software code modules 102 to 112, 114 and 115 forming the encoder 100 are resident on the hard disk drive 310 and are controlled in their execution by the processor 305.

The method 1250 will be described by way of example with reference to the block 707 of coeff_abs_level_remaining values of FIG. 7. The method 1250 encodes zero or more coeff_abs_level_remaining values into the block 707 of the stream portion 501.

The method 1250 begins at initialization step 1251, where the Golomb-Rice parameter K is initially estimated by the encoder module 104 under execution of the processor 305. The initial value of K may be stored in the memory 306. Also at step 1251, the encoder module 104 determines necessity of the parameter K adaptation during the encoding.

Then at decision step 1257, if the encoder module 104 determines that adaptation is necessary, then the method 1250 proceeds to step 1252. The adaption decision step 1257 will be described in more detail below. Otherwise, the method 1250 proceeds to step 1255.

At decision step 1252, if the encoder module 104 determines that there are more coeff_abs_level_remaining values to encode then the method 1250 proceeds to step 1253. Otherwise, the method 1250 concludes.

At encoding step 1253, the encoder module 104 performs encoding of the Golomb-Rice code-word into the block 707 in accordance with the initial value of the Golomb-Rice parameter K as described above with reference to Tables 900 and 1000.

Then at updating step 1254, the encoder module 104 performs adaptation of the value of the parameter K to be used for encoding the next coeff_abs_level_remaining value. The next value $K_{n+1}$ of the parameter K is determined at step 1254 based on two parameters: the current value of the parameter $K_n$ and a last decoded coeff_abs_level_remaining value. Step 1254 may be determined using a look-up table 1100 as shown in FIG. 11. The look-up table 1100 may be stored in the memory 306 and/or the hard disk drive 310. The look-up table 1100 provides values for $K_{n+1}$ using the value $K_n$ as the column and the residual coefficient magnitude as the row. For example, if the current value of the parameter K is one (1) and the last decoded coeff_abs_level_remaining value is twelve (12) then the next value of the parameter K is three (3).

At decision step 1255, if the encoder module 104 determines that there are more coeff_abs_level_remaining values to encode, then the method 1250 proceeds to step 1256. Otherwise, the method 1250 concludes.

At encoding step 1256, the encoder module 104 performs encoding of the Golomb-Rice code-word into the block 707 and stores the encoded Golomb-Rice code-word in the memory 306.

Figure 12B:
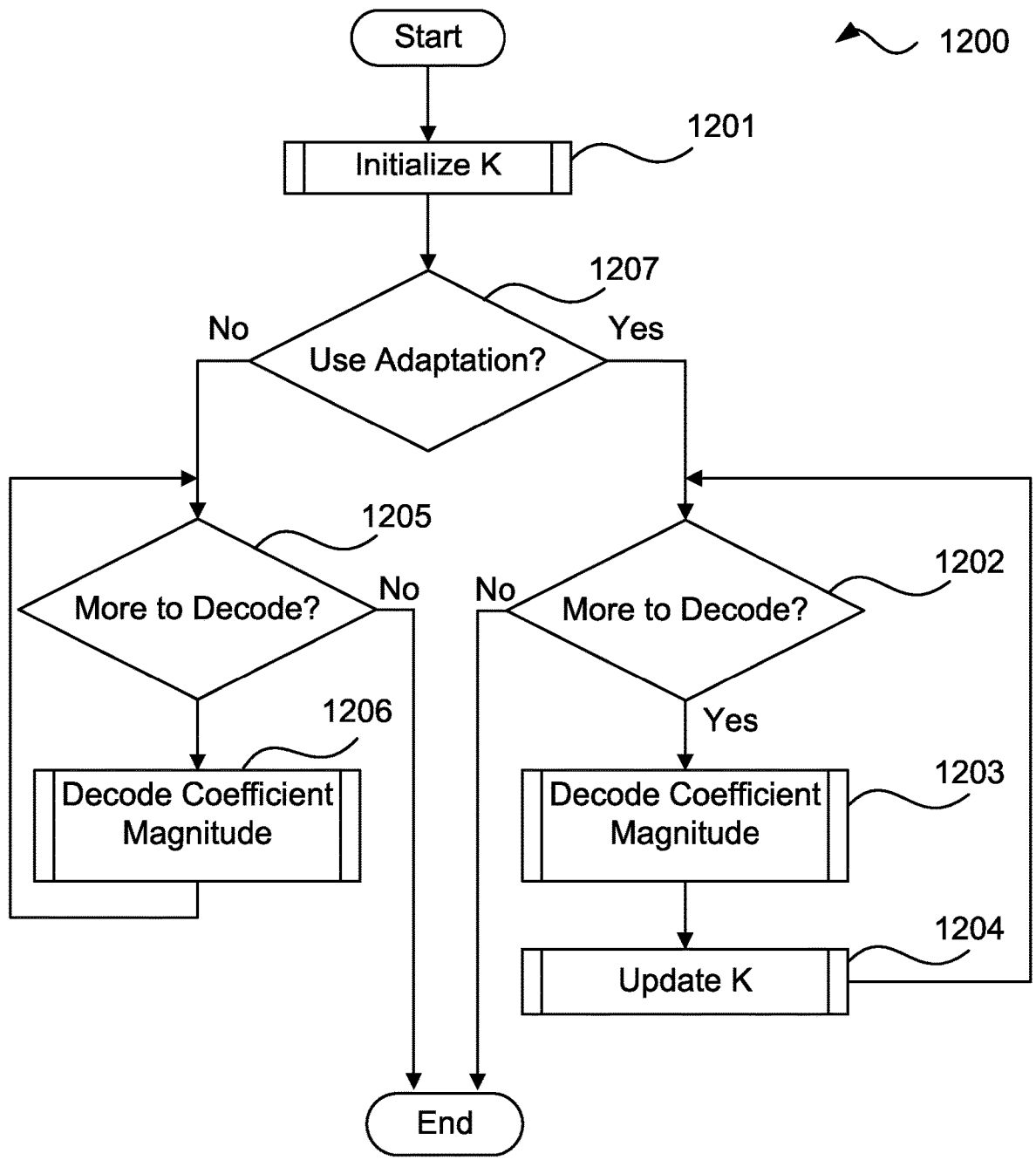
FIG. 12B is a schematic flow diagram showing a method of decoding a residual coefficient.

A method 1200 of decoding a block of coeff_abs_level_remaining values of a sub-set of a transform unit (TU) will now be described with the reference to FIG. 11 and FIG. 12B. The decoding is performed in accordance with the method 1200 using Golomb-Rice decoding. The method 1200 may be implemented as part of the entropy decoder module 202 to 208 of the decoder 200. As described above, the software code modules 202 to 208 and 210 forming the decoder 200 are resident on the hard disk drive 310 and are controlled in their execution by the processor 305.

The method 1200 will be described by way of example with reference to the block 707 of coeff_abs_level_remaining values of FIG. 7. The method 1200 decodes zero or more coeff_abs_level_remaining values (i.e., values of residual coefficient remaining magnitude) from the block 707 of the bit-stream portion 501.

The method 1200 begins at initialization step 1201, where a Golomb-Rice parameter K is initially determined by the decoder module 202 under execution of the processor 305. Also at step 1201, the decoder module 202 determines necessity of the parameter K adaptation during the decoding. Step 1201 is the same as the step 1251.

Then at decision step 1207, if the decoder module 202 determines that adaptation is necessary, as will be described below, then the method 1200 proceeds to step 1202. Otherwise, the method 1200 proceeds to step 1205.

Then at decision step 1202, if the decoder module 202 determines that there are more coeff_abs_level_remaining values to decode, then the method 1200 proceeds to step 1203. Otherwise, the method 1200 concludes.

At decoding step 1203, the decoder module 202 performs decoding the Golomb-Rice code-word from the block 707 stored in memory 306

Then at updating step 1204,the decoder module 202 performs adaptation of the value of the parameter K to be used for Golomb-Rice decoding of the next coeff_abs_level_remaining value of the sub-set. The procedure of adaptation performed at step 1204 is the same as used at step 1254 described above.

At decision step 1205, if the decoder module 202 determines that there are more coeff_abs_level_remaining values to decode, then the method 1200 proceeds to step 1206. Otherwise, the method 1200 concludes.

At decoding step 1206, the decoder module 202 performs decoding of the Golomb-Rice code-word from the block 707 using Golomb-Rice decoding. The decoded Golomb-Rice code-word may be stored in the memory 306.

The adaptive and non-adaptive decoding of remaining residual coefficient magnitude values will now be described with reference to FIG. 14A and FIG. 14B.

Figure 14A:
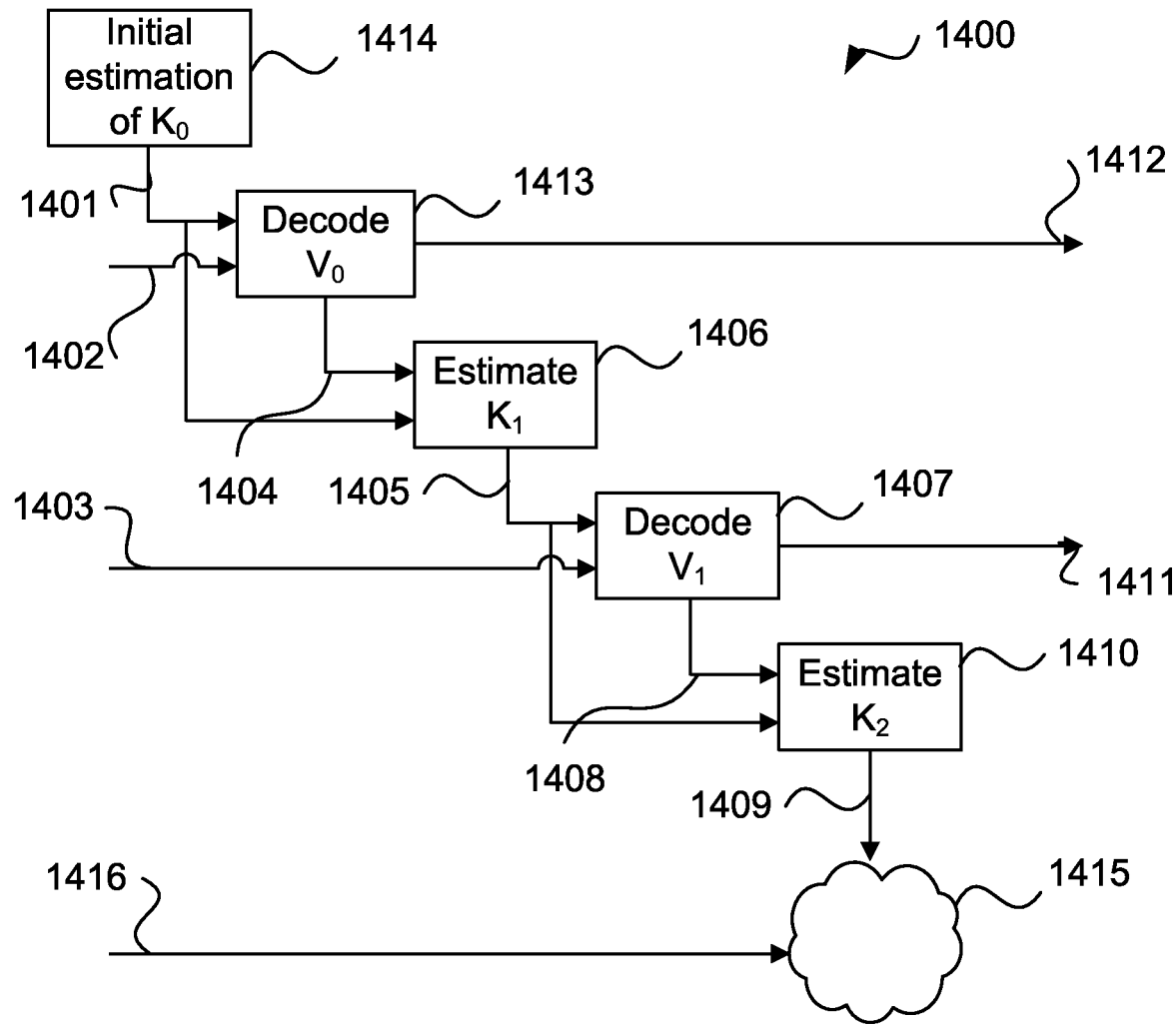
FIG. 14A shows a binariser for decoding remaining residual coefficient magnitude values for a sub-set of a transform unit (TU)

FIG. 14A shows a coeff_abs_level_remaining binariser 1400. The binariser module 1400 may be implemented using the computer system 300 where various functional modules 1414, 1413, 1406, 1407 and 1410 may be implemented by software executable within the computer system 300. Alternatively, the binariser 1400 may be implemented by dedicated hardware within the computer system 300. In still another alternative, the binariser 1400 may be implemented by a combination of dedicated hardware and software executable within the computer system 300.

The binariser 1400 may be implemented as part of the decoder module 202 of the decoder 200. Alternatively, the binariser 1400 may also be implemented as part of the encoder module 104 of the decoder 100.

The binariser 1400 decodes remaining residual coefficient magnitude values for a sub-set of a transform unit (TU).

The binariser1400 uses adaptive estimation of the parameter K. The binariser 1400 comprises an initial estimation of $K_o$ module 1414 which performs initial estimation of the parameter K as described above.

A module 1413 decodes a remaining residual coefficient magnitude $V_0$. Module 1413 accepts input Golomb-Rice code-word 1402 and the initially estimated value 1401 of the parameter K. Once module 1413 completes decoding a decoded remaining residual coefficient magnitude value 1412 is output as seen in FIG. 14A.

Module 1406 performs adaptation of the parameter K value based on the initially estimated value 1401 of the parameter K and the value 1404 decoded by the module 1403 as described above.

Module 1407 decodes a remaining residual coefficient magnitude $V_1$. Module 1407 accepts as input a Golomb-Rice code-word 1403 and an estimated value 1405 of the parameter K. Once module 1407 completes decoding a decoded remaining residual coefficient magnitude value 1411 is output.

Module 1410 performs adaptation of the parameter K value based on the previous value 1405 of the parameter K and the value 1408 decoded by the module 1407.

Estimated value 1409 of the parameter K maybe used by next Golomb-Rice decoding and adaptation modules 1415. Module 1410 depends on the data provided by the module 1407 which depends on the data provided by the module 1406 which depends on the data provided by the module 1413. As such, parallel execution of the decoding modules 1413 and 1410 is difficult. Further decoding and adaptation modules 1415 also depend both on input data 1416 as well as on previously estimated values of the parameter K. However, the adaptation steps such as steps 1406 and 1410 do not affect the actual value of the parameter K if the value of the parameter K is already optimal. Avoiding adaptation steps where it is redundant may improve decoding throughput without considerable impact on the coding efficiency.

Figure 14B:
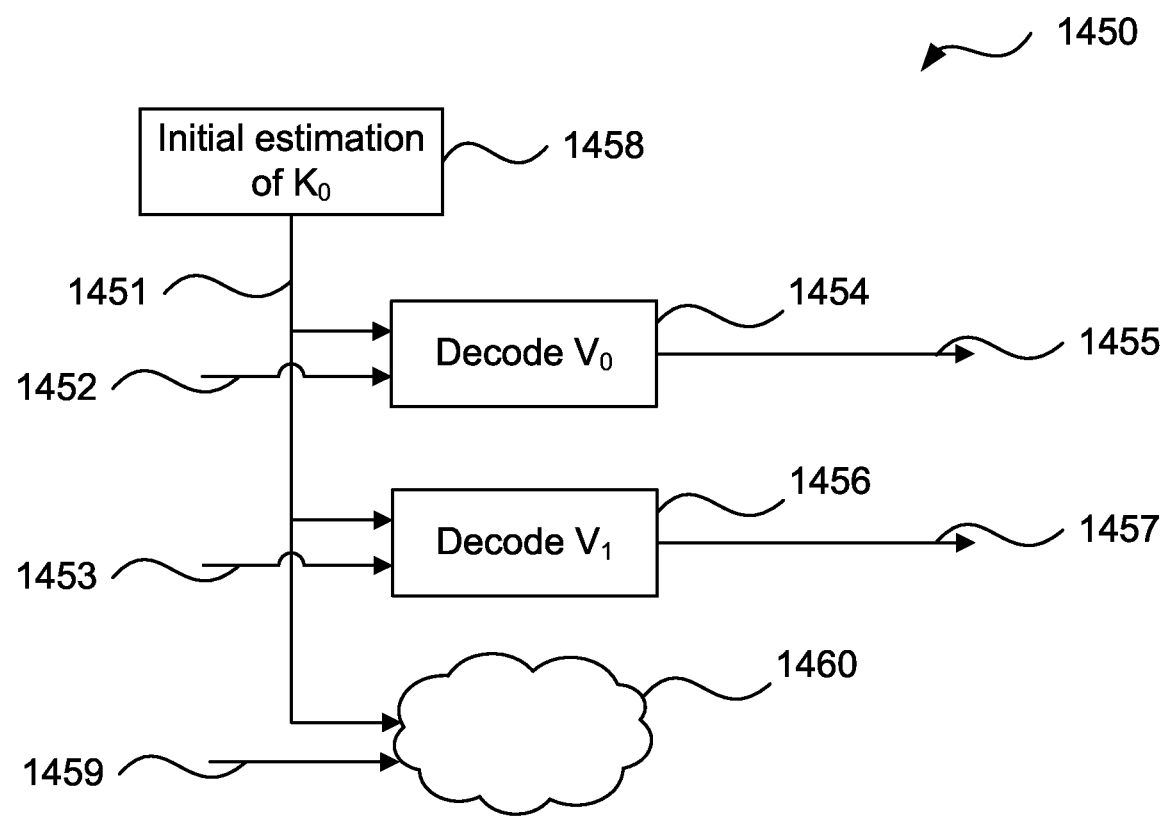
FIG. 14B shows another binariser for decoding remaining residual coefficient magnitude values for a sub-set of a transform unit (TU)

FIG. 14B shows another coeff_abs_level_remaining binariser 1450. Again, the binariser module 1450 may be implemented using the computer system 300 where various functional modules 1414, 1413, 1406, 1407 and 1410 may be implemented by software executable within the computer system 300. Alternatively, the binariser 1450 may be implemented by dedicated hardware within the computer system 300. In still another alternative, the binariser 1450 may be implemented by a combination of dedicated hardware and software executable within the computer system 300.

Again, the binariser 1450 may implemented as part of the decoder module 202 of the decoder 200. Alternatively, the binariser 1450 may also be implemented as part of the encoder module 104 of the decoder 100.

The binariser1450 does not use adaptive estimation of the parameter K. The binarizer 1450 achieves parallelism by decoding multiple residual coefficients per clock cycle.

Module 1458 performs initial estimation of the parameter K as described above.

Module 1454 decodes a remaining residual coefficient magnitude $V_0$ as described above.

Module 1454 then accepts input Golomb-Rice code-word 1452 and the initially estimated value 1451 of the parameter K. Module 1456 decodes a remaining residual coefficient magnitude $V_1$. Module 1456 accepts as input a Golomb-Rice code-word 1453 and the initially estimated value 1451 of the parameter K.

Further decoding modules 1460 will also accept their corresponding input Golomb-Rice code-words 1459 and the initially estimated value 1451 of the parameter K.

Modules 1454, 1456 and all further decoder modules 1460 do not have any data dependencies and can be executed in parallel.

Figure 13:
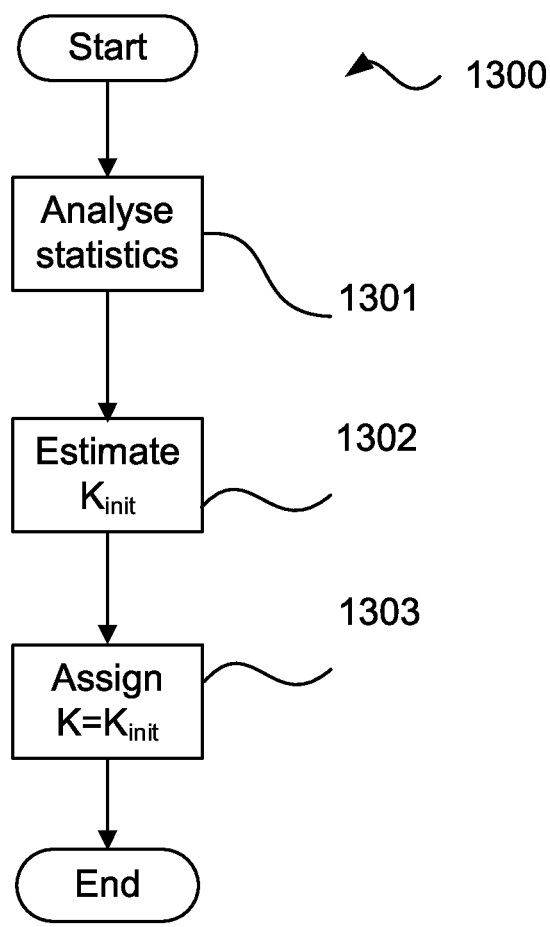
FIG. 13 is a schematic flow diagram showing a method for determining the value of a parameter K as used by the method for decoding a residual coefficient using Golomb-Rice decoding.

A method 1300 of determining a value of the parameter K for decoding a block of coeff_abs_level_remaining values of a sub-set of a transform unit (TU) will now be described with the reference to FIG. 13.

The method 1300 is used by both the encoder 100 and decoder 200 to guarantee correct decoding of data. As such, the method 1300 may be implemented as part of the entropy encoder modules 104 of the encoder 100. Further, the method 1300 may be implemented as part of the entropy decoder module 202 of the decoder 200.

The method 1300 will be described by way of example with reference to the decoder 200.

The method 1300 begins at step 1301, where the decoder module 202, under execution of the processor 305, analyses previously decoded information for a current sub-set and previously decoded sub-sets of the transform unit (TU). The previously decoded information for the current sub-set may be accessed from the memory 306. Step 1301 will be described in further detail below.

Then at step 1302, the decoder module 202 determines whether the decoding will use adaptation and determines a value for the parameter K. Step 1302 will be described in further detail below.

At step 1303, the value of the parameter K estimated at step 1302 is assigned by the decoder module 202 to a variable configured within the memory 306 holding the parameter K. Following step 1303, the method 1300 concludes.

In one implementation, step 1301 may analyse whether the number of non-zero residual coefficients in the current sub-set is greater than a predetermined threshold value T. If the number of non-zero (significant) residual coefficients is greater than the predetermined threshold then the parameter K is assigned an offset value $K_{offset}$. The offset value will result in the parameter K having a non-zero value that is offset from zero by the value of $K_{offset}$. The value of $K_{offset}$ may be as predetermined value and set to one (1). Otherwise, the parameter K is assigned a zero setting value $K_{zero}$.

For the HEVC test model 6.0 ("HM-6.0"), the threshold value T used to make the decision would be fourteen (14). The offset value $K_{offset}$ of the parameter K would be one (1) and the zero setting value $K_{zero}$ would be zero (0).

In another implementation, the value of the quantization parameter Q and the index of the current subset I may be analysed at step 1301. In such an implementation, if the value of the quantization parameter Q is less than a predetermined threshold $T_Q$ and the value of the subset index I is less than a predetermined threshold $I_{subset}$ then the parameter K is assigned an offset value $K_{offset}$. Otherwise, the parameter K is assigned a zero setting value $K_{zero}$.

For the HEVC test model 6.0 ("HM-6.0"), the threshold value of the quantization parameter $T_Q$ used to make the decision would be ten (10) and the value of the subset index $I_{subset}$ used to make the decision would be one (1). The offset value $K_{offset}$ of the parameter K would be one (1) and the zero setting value $K_{zero}$ would be zero (0).

The values of transform unit width and height may additionally be analysed at step 1301. In such an implementation, if the values of transform unit width and height are greater than predetermined thresholds $T_{width}$ and $T_{height}$ then the parameter K is assigned an offset value $K_{offset}$. Otherwise, the parameter K is assigned a zero setting value $K_{zero}$.

For the HEVC test model 6.0 ("HM-6.0"), the threshold values of transform unit width and height $T_{width}$ and $T_{height}$ used to make the decision would be eight (8) and eight (8). The offset value $K_{offset}$ of the parameter K would be one (1) and the zero setting value $K_{zero}$ would be zero (0).

A decision about using adaptation during encoding or decoding of a sub-set maybe made at step 1302 based on the index of the sub-set. If the index is equal to or greater than a predetermined value $I_{max}$ then at step 1257 of encoder method 1250 and at step 1207 of decoder method 1200, the method proceeds to the step 1205 of decoder and step 1255 of encoder and does not use adaptation of the parameter K. Having a fixed Rice parameter K may be considered as dependency free Golomb-Rice encoding or decoding. Otherwise, the method proceeds to step 1202 of method 1200 and step 1252 of method 1250 and uses adaptation of the parameter K. Having an adaptive Rice parameter K may be considered as dependency based Golomb-Rice encoding or decoding.

Figure 15:
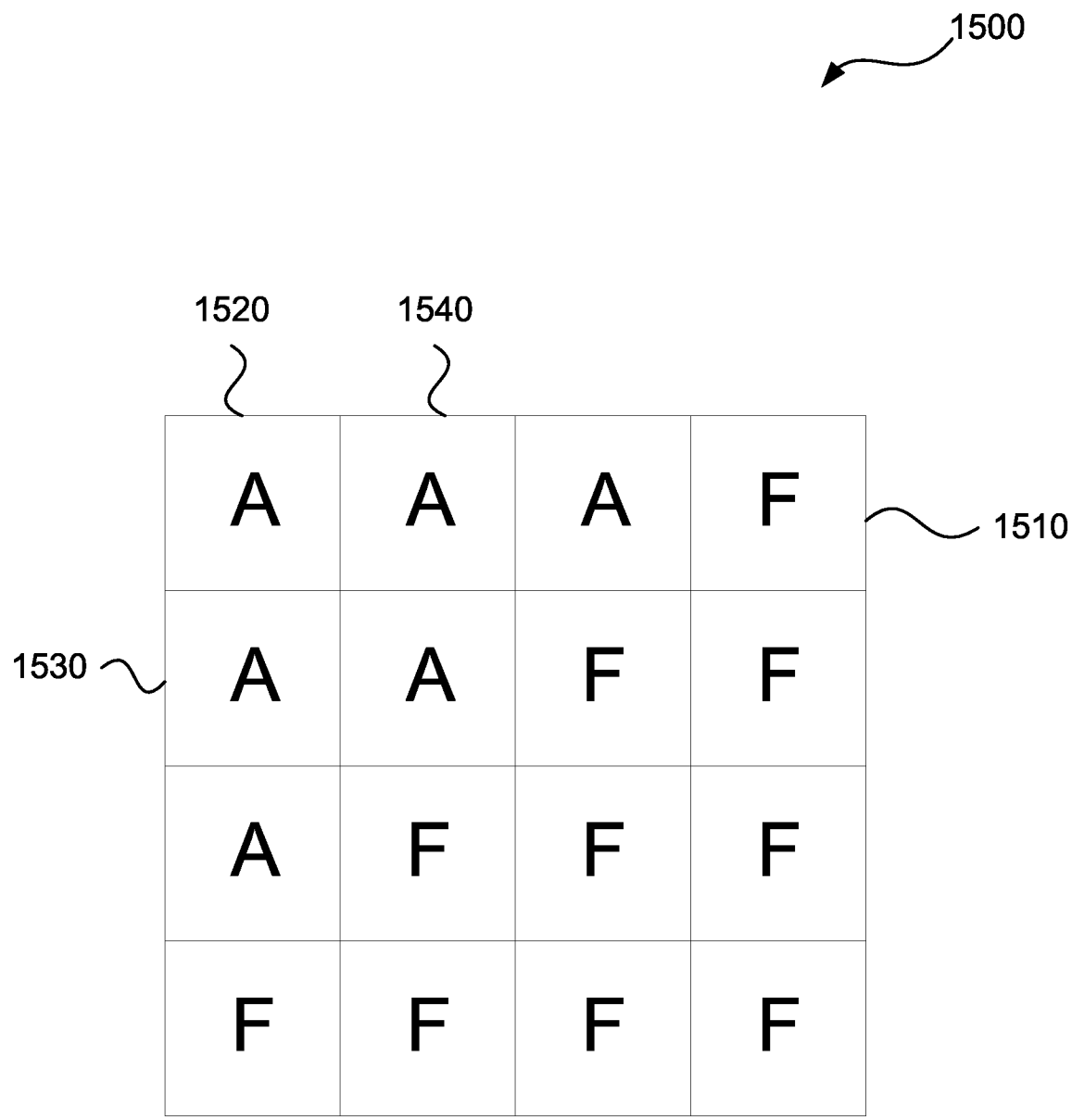
FIG. 15 shows another example transform unit.

For the HEVC test model 6.0 ("HM_6.0"), the threshold value of the index would be six (6). FIG. 15 shows an example transform unit 1500 where the threshold value six (6) of the index $I_{max}$ is used at step 1302 to make a decision about using adaptation during encoding or decoding of a subset. A backward diagonal scan pattern is assumed in the example of FIG. 15. Transform unit 1500 is split into sixteen subsets such as sub-set 1510. Every subset in FIG. 15 is marked with either letter "A" or letter "F" where sub-sets marked with letter "A" indicate sub-sets that are encoded and decoded using adaptive Rice parameters K; while sub-sets marked with "F" indicate sub-sets using fixed Rice parameters K when using a threshold value of six (6) for the index $I_{max}$ at step 1302. The value of six for the index $I_{max}$ results in the "A" sub-sets using adaptive Rice parameters K within the sub-set. Sub-set marked with the letter "F" indicate sub-sets in positions in the TU 1500 where a threshold value of six (6) for the index $I_{max}$ result in the sub-sets using a fixed Rice parameter. The threshold value of index $I_{max}$ is the same for all of the sub-sets in the TU 1500, the location of the sub-set in the TU 1500 is compared to the threshold to determine if an adaptive Rice parameter is to be used for encoding and decoding. The value of the threshold index $I_{max}$ is used to select a boundary between the adaptive and fixed sub-sets in FIG. 15. The sub-set order starts at zero (0) for the top left sub-set 1520 and proceeds in a reverse scan order with sub-set 1530 as one (1) and sub-set 1540 as sub-set two (2).

In another implementation, a decision about using adaptation during encoding or decoding of a sub-set maybe made at step 1302 based on a number $G_1$ of residual coefficients greater than one and a number $G_2$ of residual coefficients greater than two in a previously encoded or decoded sub-set. However, such a method does not apply to the case when there is no previously encoded or decoded sub-set. When there is a previously encoded or decoded sub-set, then if the value $(G_2-G_1)$ is greater than a predetermined threshold $T_{21}$, then at step 1257 of encoder method 1250 (or at step 1207 of decoder method 1200) the method 1250 proceeds to step 1255 of encoder method 1250 (or step 1205 of decoder method 1200) and does not use adaptation of the parameter K. Otherwise, the method 1250 proceeds to step 1252 of encoder method 1250 (or the method 1200 proceeds to step 1202 of decoder method 1200) and uses adaptation of the parameter K.

For the HEVC test model 6.0 the threshold value of the index $T_{21}$ would be four (4).

The methods 1250 and 1300 when applied to video encoder 100 and the methods 1200 and 1300 when applied to decoder 200, enable implementations to realise a more efficient compression of frame data, such as frame data 101. The described methods also enable implementations to realise an increase in the throughput of parsing an encoded bit-stream, such as encoded bitstream 113. More efficient compression of frame data occurs through using better estimation of Golomb-Rice parameter K which allows shorter code-words to be assigned to encoded symbols.

Higher throughput may be achieved through allowing implementations to use the described methods of decoding Golomb-Rice code-words which can decode more than one code-word at a time by eliminating data dependencies between the code-words.

INDUSTRIAL APPLICABILITY

The arrangements described are applicable to the computer and data processing industries and particularly for the digital signal processing for the encoding a decoding of signals such as video signals.

The foregoing describes only some embodiments of the present invention, and modifications and/or changes can be made thereto without departing from the scope and spirit of the invention, the embodiments being illustrative and not restrictive.

In the context of this specification, the word "comprising" means "including principally but not necessarily solely" or "having" or "including", and not "consisting only of". Variations of the word "comprising", such as "comprise" and "comprises" have correspondingly varied meanings.

The invention claimed is:

1. A decoding method for decoding a subset of a plurality of sub-sets of a transform unit of encoded video data using a Golomb-Rice method, the decoding method comprising:
   determining, in a unit of the subset of the plurality of sub-sets of the transform unit, an initial value of a Rice parameter for decoding a current subset of the plurality of sub-sets of the transform unit, using statistics of previously decoded residual coefficient values for a previous sub-set of the plurality of sub-sets of the transform unit, each of the subsets comprising a plurality of residual coefficient values being arranged as an array of four residual coefficient values by four residual coefficient values, wherein the transform unit is a unit for transform between a frequency-domain and a spatial-domain, and the transform unit is scanned on a subset-by-subset basis;
   performing initialization which initializes, in a unit of the subset of the plurality of sub-sets of the transform unit, the Rice parameter to the determined initial value; and
   decoding the current subset of the plurality of sub-sets of the transform unit using the Golomb-Rice method, wherein the initialized Rice parameter is used as an initial Rice parameter for decoding the current subset, and wherein a modified Rice parameter, modified from the initialized Rice parameter by using a method different from the initialization, is used as a Rice parameter for decoding the current subset, wherein the method for modification uses a last coeff abs level remaining which is a remaining absolute value of a coefficient level that is coded with Golomb-Rice code.

2. The decoding method according to the claim 1, wherein the initialized Rice parameter is determined from information decoded for the transform unit prior to decoding of the current sub-set.

3. The decoding method according to the claim 2, wherein the initialized Rice parameter is offset from a zero setting when a quantization parameter is lower than a predetermined threshold.

4. The decoding method according to the claim 1, wherein the initialized Rice parameter is determined from information decoded for the current subset of the transform unit.

5. The decoding method according to the claim 4, wherein the initialized Rice parameter is offset from a zero setting when a number of significant residual coefficient values in the current subset is higher than a predetermined threshold.

6. An apparatus for decoding a subset of a plurality of sub-sets of a transform unit of encoded video data using a Golomb-Rice method, the apparatus comprising: a determining unit configured to determine an initial value of a Rice parameter for decoding a current subset of the plurality of sub-sets of the transform unit, using statistics of previously decoded residual coefficient values for a previous sub-set of the plurality of sub-sets of the transform unit, each of the subsets comprising a plurality of residual coefficient values being arranged as an array of four residual coefficient values by four residual coefficient values, wherein the transform unit is a unit for transform between a frequency-domain and a spatial-domain, and the transform unit is scanned on a subset-by-subset basis; an initialization unit configured to initialize the Rice parameter to the determined initial value; and a decoding unit configured to decode the current subset of the plurality of sub-sets of the transform unit using the Golomb-Rice method, wherein the initialized Rice parameter is used as an initial Rice parameter for decoding the current subset, and wherein a modified Rice parameter, modified from the initialized Rice parameter by using a method different from the initialization, is used as a Rice parameter for decoding the current subset, wherein the method for modification uses a last coeff_abs_level_remaining which is a remaining absolute value of a coefficient level that is coded with Golomb-Rice code.

7. A system for decoding a subset of a plurality of sub-sets of a transform unit of encoded video data using a Golomb-Rice method, the system comprising:
   a memory for storing data and a computer program;
   a processor coupled to said memory for executing said computer program, said computer program comprising code for:
   determining, in a unit of the subset of the plurality of sub-sets of the transform unit, an initial value of a Rice parameter for decoding a current subset of the plurality of sub-sets of the transform unit, using statistics of previously decoded residual coefficient values for a previous sub-set of the plurality of sub-sets of the transform unit, each of the subsets comprising a plurality of residual coefficient values being arranged as an array of four residual coefficient values by four residual coefficient values, wherein the transform unit is a unit for transform between a frequency-domain and a spatial-domain, and the transform unit is scanned on a subset-by-subset basis; and
   performing initialization which initializes, in a unit of the subset of the plurality of sub-sets of the transform unit, the Rice parameter to the determined initial value; and
   decoding the current subset of the plurality of sub-sets of the transform unit using the Golomb-Rice method, wherein the initialized Rice parameter is used as an initial Rice parameter for decoding the current subset, and wherein a modified Rice parameter, modified from the initialized Rice parameter by using a method different from the initialization, is used as a Rice parameter for decoding the current subset, wherein the method for modification uses a last coeff abs level remaining which is a remaining absolute value of a coefficient level that is coded with Golomb-Rice code.

8. A non-transitory computer readable medium having a computer program recorded thereon for decoding a subset of a plurality of sub-sets of a transform unit of encoded video data using a Golomb-Rice method, the program comprising:

code for determining, in a unit of the subset of the plurality of sub-sets of the transform unit, an initial value of a Rice parameter for decoding a current subset of the plurality of sub-sets of the transform unit, using statistics of previously decoded residual coefficient values for a previous sub-set of the plurality of sub-sets of the transform unit, each of the subsets comprising a plurality of residual coefficient values being arranged as an array of four residual coefficient values by four residual coefficient values, wherein the transform unit is a unit for transform between a frequency-domain and a spatial-domain, and the transform unit is scanned on a subset-by-subset basis;

code for performing initialization which initializes, in a unit of the subset of the plurality of sub-sets of the transform unit, the Rice parameter to the determined initial value; and code for decoding the current subset of the plurality of sub-sets of the transform unit using the Golomb-Rice method, wherein the initialized Rice parameter is used as an initial Rice parameter for decoding the current subset, and wherein a modified Rice parameter, modified from the initialized Rice parameter by using a method different from the initialization, is used as a Rice parameter for decoding the current subset, wherein the method for modification uses a last coeff abs level remaining which is a remaining absolute value of a coefficient level that is coded with Golomb-Rice code.

9. An encoding method for encoding a subset of a plurality of sub-sets of a transform unit of video data using a Golomb-Rice method, the encoding method comprising:

determining, in a unit of the subset of the plurality of sub-sets of the transform unit, an initial value of a Rice parameter for encoding a current subset of the plurality of sub-sets of the transform unit, using statistics of previously encoded residual coefficient values for a previous sub-set of the plurality of sub-sets of the transform unit, each of the subsets comprising a plurality of residual coefficient values being arranged as an array of four residual coefficient values by four residual coefficient values, wherein the transform unit is a unit for transform between a frequency-domain and a spatial-domain, and the transform unit is scanned on a subset-by-subset basis;

performing initialization which initializes, in a unit of the subset of the plurality of sub-sets of the transform unit, the Rice parameter to the determined initial value; and encoding the current subset of the plurality of sub-sets of the transform unit using the Golomb-Rice method, wherein the initialized Rice parameter is used as an initial Rice parameter for encoding the current subset, and wherein a modified Rice parameter, modified from the initialized Rice parameter by using a method different from the initialization, is used as a Rice parameter for encoding the current subset, wherein the method for modification uses a last coeff abs level remaining which is a remaining absolute value of a coefficient level that is coded with Golomb-Rice code.

10. An apparatus for encoding a subset of a plurality of sub-sets of a transform unit of video data using a Golomb-Rice method, the apparatus comprising:

a determining unit configured to determine, in a unit of the subset of the plurality of sub-sets of the transform unit, an initial value of a Rice parameter for encoding a current subset of the plurality of sub-sets of the transform unit, using statistics of previously encoded residual coefficient values for a previous sub-set of the plurality of sub-sets of the transform unit, each of the subsets comprising a plurality of residual coefficient values being arranged as an array of four residual coefficient values by four residual coefficient values, wherein the transform unit is a unit for transform between a frequency-domain and a spatial-domain, and the transform unit is scanned on a subset-by-subset basis;

an initialization unit configured to perform initialization which initializes, in a unit of the subset of the plurality of sub-sets of the transform unit, the Rice parameter to the determined initial value; and an encoding unit configured to encode the current subset of the plurality of sub-sets of the transform unit using the Golomb-Rice method, wherein the initialized Rice parameter is used as an initial Rice parameter for encoding the current subset, and wherein a modified Rice parameter, modified from the initialized Rice parameter by using a method different from the initialization, is used as a Rice parameter for encoding the current subset, wherein the method for modification uses a last coeff abs level remaining which is a remaining absolute value of a coefficient level that is coded with Golomb-Rice code.

11. A system for encoding a subset of a plurality of sub-sets of a transform unit of video data using a Golomb-Rice method, the system comprising:

a memory for storing data and a computer program;

a processor coupled to said memory for executing said computer program, said computer program comprising code for:

determining, in a unit of the subset of the plurality of sub-sets of the transform unit, an initial value of a Rice parameter for encoding a current subset of the plurality of sub-sets of the transform unit, using statistics of previously encoded residual coefficient values for a previous sub-set of the plurality of sub-sets of the transform unit, each of the subsets comprising a plurality of residual coefficient values being arranged as an array of four residual coefficient values by four residual coefficient values, wherein the transform unit is a unit for transform between a frequency-domain and a spatial-domain, and the transform unit is scanned on a subset-by-subset basis; and performing initialization which initializes, in a unit of the subset of the plurality of sub-sets of the transform unit, the Rice parameter to the determined initial value; and encoding the current subset of the plurality of sub-sets of the transform unit using the Golomb-Rice method, wherein the initialized Rice parameter is used as an initial Rice parameter for encoding the current subset, and wherein a modified Rice parameter, modified from the initialized Rice parameter by using a method different from the initialization, is used as a Rice parameter for encoding the current subset, wherein the method for modification uses a last coeff abs level remaining which is a remaining absolute value of a coefficient level that is coded with Golomb-Rice code.

12. A non-transitory computer readable medium having a computer program recorded thereon for encoding a subset of a plurality of sub-sets of a transform unit of video data using a Golomb-Rice method, the program comprising:

code for determining, in a unit of the subset of the plurality of sub-sets of the transform unit, an initial value of a Rice parameter for encoding a current subset of the plurality of sub-sets of the transform unit, using statistics of previously encoded residual coefficient values for a previous sub-set of the plurality of sub-sets of the transform unit, each of the subsets comprising a plurality of residual coefficient values being arranged as an array of four residual coefficient values by four residual coefficient values, wherein the transform unit is a unit for transform between a frequency-domain and a spatial-domain, and the transform unit is scanned on a subset-by-subset basis;

code for performing initialization which initializes, in a unit of the subset of the plurality of sub-sets of the transform unit, the Rice parameter to the determined initial value; and code for encoding the current subset of the plurality of sub-sets of the transform unit using the Golomb-Rice method, wherein the initialized Rice parameter is used as an initial Rice parameter for encoding the current subset, and wherein a modified Rice parameter, modified from the initialized Rice parameter by using a method different from the initialization, is used as a Rice parameter for encoding the current subset, wherein the method for modification uses a last coeff abs level remaining which is a remaining absolute value of a coefficient level that is coded with Golomb-Rice code.

* * * * *